(12) United States Patent
Oike

(10) Patent No.: US 9,615,043 B2
(45) Date of Patent: *Apr. 4, 2017

(54) SOLID-STATE IMAGING ELEMENT AND CAMERA SYSTEM

(71) Applicant: Sony Corporation, Tokyo (JP)

(72) Inventor: Yusuke Oike, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,984

(22) Filed: Oct. 19, 2015

(65) Prior Publication Data

US 2016/0044266 A1 Feb. 11, 2016

Related U.S. Application Data

(63) Continuation of application No. 14/640,913, filed on Mar. 6, 2015, now Pat. No. 9,197,825, which is a (Continued)

(30) Foreign Application Priority Data

Sep. 3, 2010 (JP) ................................. 2010-197734

(51) Int. Cl.
*H04N 5/3745* (2011.01)
*H04N 5/378* (2011.01)
(Continued)

(52) U.S. Cl.
CPC ..... *H04N 5/37457* (2013.01); *H01L 27/1464* (2013.01); *H01L 27/14634* (2013.01); *H01L 27/14636* (2013.01); *H01L 27/14641* (2013.01); *H01L 27/14643* (2013.01); *H04N 5/341* (2013.01); *H04N 5/378* (2013.01); *H04N 5/3741* (2013.01); *H04N 5/3742* (2013.01); *H04N 5/3745* (2013.01)

(58) Field of Classification Search
CPC .... H04N 5/341; H04N 5/3741; H04N 5/3742; H04N 5/3745; H04N 5/37457;
(Continued)

(56) References Cited

U.S. PATENT DOCUMENTS 6,989,589 B2 * 1/2006 Hammadou ...... H01L 27/11803
257/258
7,394,148 B2 * 7/2008 Karnezos ............ H01L 23/3128
257/686
(Continued)

FOREIGN PATENT DOCUMENTS

CN 1728397 2/2006
CN 101374207 2/2009

OTHER PUBLICATIONS

Official Action (with English translation) for Chinese Patent Application No. 201110220662.6 dated Oct. 23, 2015, 15 pages.

*Primary Examiner* — Daniel M Pasiewicz
(74) *Attorney, Agent, or Firm* — Sheridan Ross P.C.

(57) ABSTRACT

A solid-state imaging element that includes a plurality of semiconductor layers stacked, a plurality of stack-connecting parts for electrically connecting the plurality of semiconductor layers, a pixel array part in which pixel cells that include a photoelectric conversion part and a signal output part are arrayed in a two-dimensional shape, and an output signal line through which signals from the signal output part of the pixel cells are propagated, in which the plurality of semiconductor layers includes at least a first semiconductor layer and a second semiconductor layer, and, in the first semiconductor layer, the plurality of pixel cells are arrayed in a two-dimensional shape, the signal output part of a pixel group formed with the plurality of pixel cells shares an output signal line wired from the stack-connecting parts, and the output signal line has a separation part which can separate each output signal line.

30 Claims, 21 Drawing Sheets

Related U.S. Application Data continuation of application No. 13/218,979, filed on Aug. 26, 2011, now Pat. No. 9,007,503.

(51) Int. Cl.
*H01L 27/146* (2006.01)
*H04N 5/341* (2011.01)
*H04N 5/374* (2011.01)

(58) Field of Classification Search
CPC ........... H01L 27/14634; H01L 27/1464; H01L 27/14641; H01L 27/14636
See application file for complete search history.

(56) References Cited

U.S. PATENT DOCUMENTS

| | | | | |
|---|---|---|---|---|
| 7,868,283 B2* | 1/2011 | Mabuchi | ........... | H01L 27/14634 250/208.1 |
| 9,007,503 B2* | 4/2015 | Oike | ................. | H01L 27/14634 250/208.1 |
| 9,197,825 B2* | 11/2015 | Oike | ................. | H01L 27/14634 |
| 2004/0104351 A1* | 6/2004 | Shibayama | ......... | H01L 27/1446 250/370.11 |
| 2006/0023109 A1* | 2/2006 | Mabuchi | ................. | H01L 24/17 348/340 |
| 2006/0243885 A1* | 11/2006 | Watanabe | ............ | H04N 3/1593 250/208.1 |
| 2007/0285538 A1* | 12/2007 | Suzuki | ................... | H04N 3/155 348/272 |
| 2008/0088014 A1* | 4/2008 | Adkisson | .......... | H01L 27/14618 257/737 |
| 2009/0051801 A1* | 2/2009 | Mishina | ............... | H04N 5/3742 348/311 |
| 2009/0230287 A1* | 9/2009 | Anderson | ............ | G02B 3/0056 250/208.1 |
| 2010/0276572 A1* | 11/2010 | Iwabuchi | ............ | H01L 27/1464 250/208.1 |
| 2012/0307030 A1* | 12/2012 | Blanquart | ......... | H01L 27/14601 348/76 |

* cited by examiner

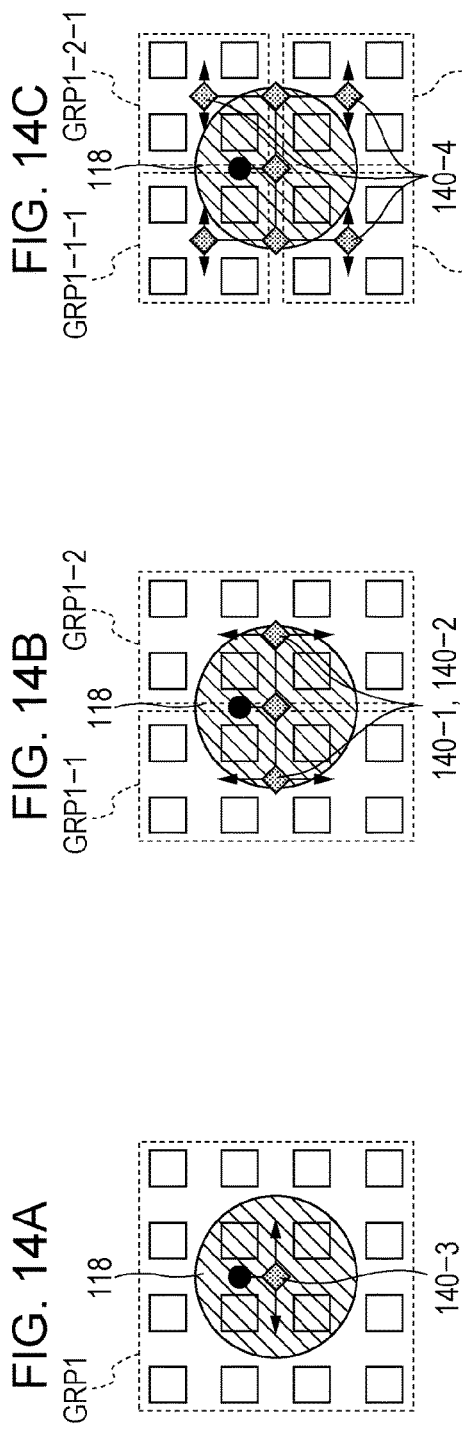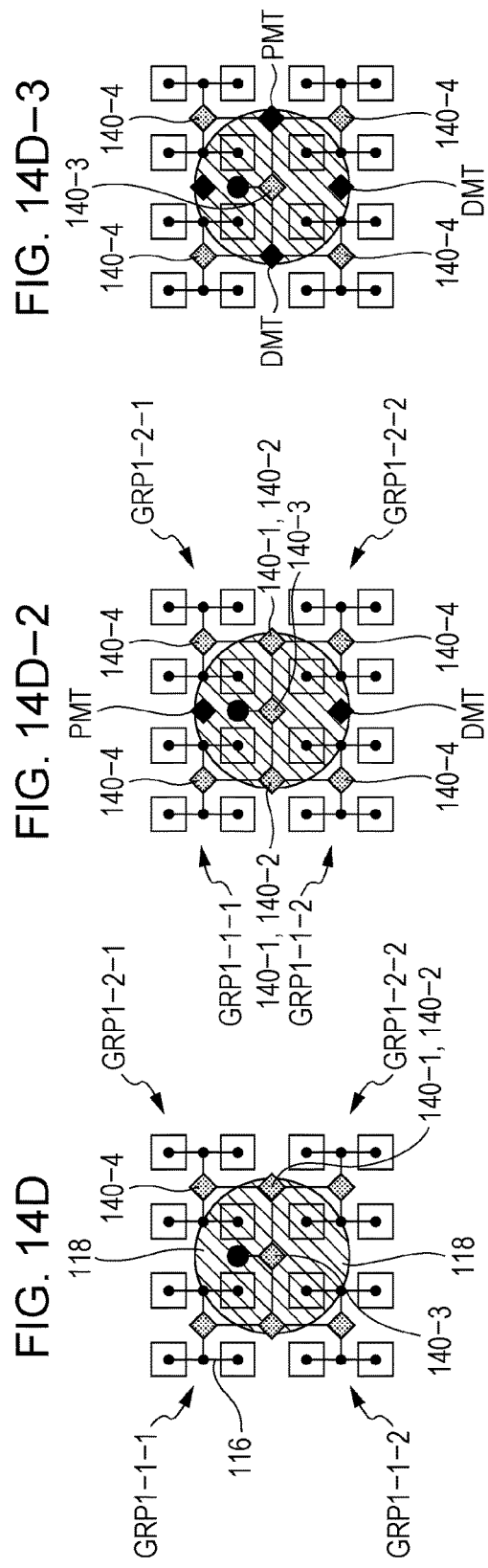

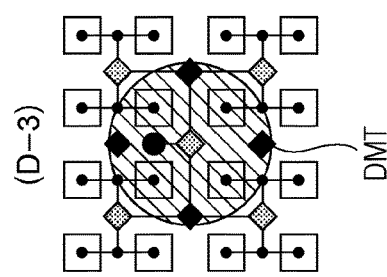
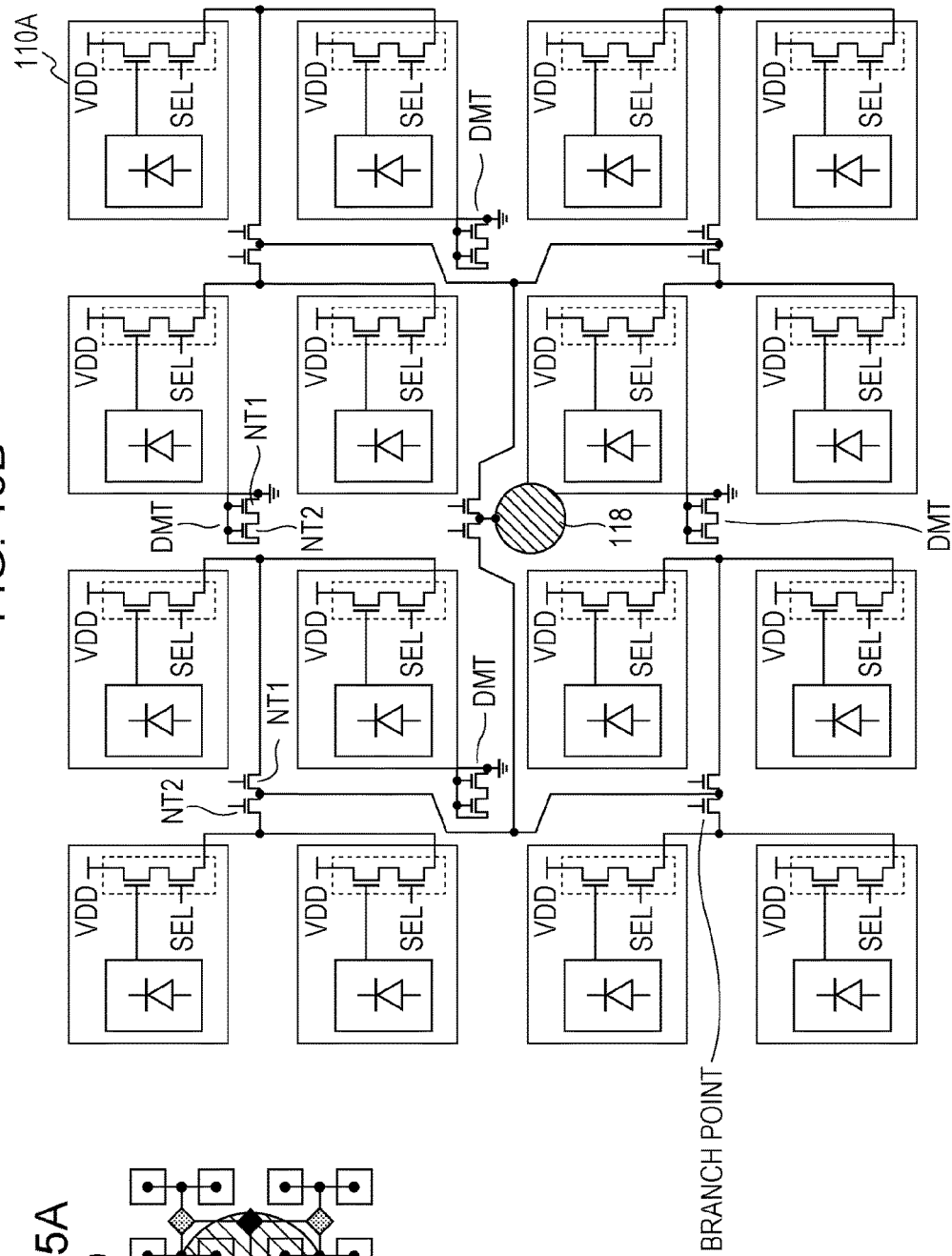

SOLID-STATE IMAGING ELEMENT AND CAMERA SYSTEM

RELATED APPLICATION DATA

This application is a continuation of U.S. patent application Ser. No. 14/640,913, filed Mar. 6, 2015 which is a continuation of U.S. patent application Ser. No. 13/218,979, filed Aug. 26, 2011, now U.S. Pat. No. 9,007,503, which claims priority to Japanese Patent Application No. JP 2010-197734, filed in the Japan Patent Office on Sep. 3, 2010 the entire disclosures of which are hereby incorporated herein by reference.

BACKGROUND

The present technology relates to a solid-state imaging element represented by a CMOS image sensor and a camera system.

A solid-state imaging element is configured to have a photoelectric conversion unit, a charge voltage conversion unit which converts accumulated charges into a voltage, and a unit pixel with an amplifying circuit for reading the voltage of the charge voltage conversion unit.

There has been a proposed technology with regard to such a solid-state imaging element in which the opposite side (=back face) of a face where transistors are arranged is set to a light-irradiated face, and a plurality of semiconductor layers is stacked to read an output signal of pixels, thereby improving the degree of integration and parallelism.

The technology is disclosed in, for example, Japanese Unexamined Patent Application Publication No. 2006-049361.

FIG. 1 is a diagram showing a basic configuration of a solid-state imaging element disclosed in Japanese Unexamined Patent Application Publication No. 2006-049361.

In FIG. 1, pixel cells 2 are arranged in an array shape on a first semiconductor layer 1-1 in the light sensing part side, row scanning circuits 3-1 and 3-2 are arranged in both sides of the array part, and pixel driving circuits 4-1 and 4-2 are arranged corresponding to the rows of the pixel cells 2.

FIG. 2 is a diagram showing an example of a pixel of a CMOS image sensor which includes four transistors.

The pixel cells 2 include a photoelectric conversion unit (photoelectric conversion element) 21 composed of, for example, a photodiode (PD).

In addition, the pixel cells 2 include four transistors including a transfer transistor 22, a reset transistor 23, an amplifying transistor 24, and a selection transistor 25 for the one photoelectric conversion unit 21 as active elements.

The photoelectric conversion unit 21 performs photoelectric conversion of incident light into charges (herein, electrons) in an amount corresponding to the quantity of the light.

The transfer transistor 22 is connected between the photoelectric conversion unit 21 and a floating diffusion FD as an output node, and the gate thereof (transfer gate) is given a transfer signal TRG that is a control signal through a transfer control line LTRG.

Accordingly, the transfer transistor 22 transfers the electrons photoelectrically converted in the photoelectric conversion unit 21 to the floating diffusion FD.

The reset transistor 23 is connected between a power supply line LVDD and the floating diffusion FD, and the gate thereof is given a reset signal RST that is a control signal through a reset control line LRST.

Accordingly, the reset transistor 23 resets the potential of the floating diffusion FD to the potential of the power supply line LVDD.

The gate of the amplifying transistor 24 is connected to the floating diffusion FD. The amplifying transistor 24 is connected to an output signal line 6 through the selection transistor 25, and constitutes a source follower as a constant current source outside the pixel part.

The amplifying transistor 24 and the selection transistor 25 form an amplifying circuit 7.

In addition, a selection signal SEL that is a control signal is given to the gate of the selection transistor 25 through a selection control line LSEL according to an address signal to turn on the selection transistor 25.

If the selection transistor 25 is turned on, the amplifying transistor 24 amplifies the potential of the floating diffusion FD and outputs a voltage according to the potential to the output signal line 6.

FIG. 3 is a diagram showing an example of pixel sharing of a COMS image sensor.

In this configuration, four pixel cells 2-1 to 2-4 having each of photoelectric conversion elements 21-1 to 21-4 and transfer transistors 22-1 to 22-4 share the floating diffusion FD, the reset transistor 23, and the amplifying circuit 7.

In the solid-state imaging element, the pixel cells of FIG. 2 that have one amplifying circuit 7 for one photoelectric conversion unit 21 formed on the first semiconductor layer 1-1, the pixel cells of FIG. 3 that have one amplifying circuit 7 for a plurality of photoelectric conversion units 21, or the like is applied as shown in FIG. 1.

In addition, the solid-state imaging element in Japanese Unexamined Patent Application Publication No. 2006-049361 has a structure in which stack-connecting terminals (micro-bumps or through holes VIA) 8 that propagate signals to a different stacked second semiconductor layer 1-2 are connected in the pixel cells 2.

In other words, each of the stack-connecting terminals 8 is connected to the amplifying circuit 7 that reads signals.

In the examples of FIGS. 2 and 3, a bias transistor (load MOS) 9 that functions as a constant current source of a source follower is formed on the second semiconductor layer 1-2.

SUMMARY

When the size of a unit pixel is smaller than the size of the stack-connecting terminal 8, it is difficult to arrange the stack-connecting terminals 8 for each of unit pixels in any event in the above-described related art.

For this reason, it is considered that the output of the amplifying circuits of a plurality of pixel cells shares an output signal line connected to the stack-connecting terminals as shown in FIG. 4.

FIG. 5 is a diagram showing an example of principal circuits of the solid-state imaging element of FIG. 4.

In this example, output terminals of the amplifying circuits 7 reading the plurality of pixel cells are connected to the same output signal line 6, and the connection node thereof is connected to the second semiconductor layer 1-2 through the stack-connecting terminal 8.

The pixel cells 2 include a plurality of photoelectric conversion units (PD) as shown in FIG. 2, and it does not matter to share the amplifying circuit 7.

As described above, the amplifying circuit 7 includes the selection transistor 25 in addition to the amplifying transistor 24, and is connected to the output signal line 6 through the selection transistor 25.

However, it is possible to omit the selection transistor 25 by setting the voltage of the FD in a non-selected pixel to be low using the reset transistor 23 and by driving the amplifying transistor 24 to be in an OFF state.

In the configuration of FIGS. 4 and 5, when a pixel is selected by the row scanning circuit 3 and signals are output through the stack-connecting terminal 8, it is necessary to drive parasitic capacitance of the output terminal of the amplifying circuit 7 of other pixels connected to the same stack-connecting terminal 8.

In other words, parasitic capacitance of a source terminal of the amplifying transistor 24, parasitic capacitance of a source terminal of the selection transistor 25, or parasitic capacitance of wiring is added as load capacity.

With an increase in the parasitic capacitance of the output signal line 6 including the stack-connecting terminal 8, the time necessary for converging an output signal after the selection of a pixel on a target value is lengthened, thereby obstructing speed-up.

When it is necessary to perform a further speedy reading operation, elevating a current flowing into the amplifying circuit 7 by changing, for example, a bias voltage Vb applied to the gate of the bias transistor 9 is considered, but an increase in power consumption results in proportion to increments of the current.

It is desirable for the technology to provide a solid-state imaging element and a camera system which enable the realization of speed increases in driving an output signal line of a pixel and low power consumption in a stacking structure.

According to an embodiment of the present technology, there is provided a solid-state imaging element which includes a plurality of semiconductor layers stacked, a plurality of stack-connecting parts for electrically connecting the plurality of semiconductor layers, a pixel array part in which pixel cells that include a photoelectric conversion part and a signal output part are arrayed in a two-dimensional shape, and an output signal line through which signals from the signal output part of the pixel cells are propagated, and in which the plurality of semiconductor layers includes at least a first semiconductor layer and a second semiconductor layer, and, in the first semiconductor layer, the plurality of pixel cells are arrayed in a two-dimensional shape, the signal output part of a pixel group formed with the plurality of pixel cells shares an output signal line which is wired from the stack-connecting part, and the output signal line has a separation part which can separate each output signal line that is arbitrarily branched at all or some locations branched from the stack-connecting part.

According to another embodiment of the technology, there is provided a camera system which includes a solid-state imaging element, an optical system which forms an image of a subject on the imaging element, and a signal processing circuit which processes an output image signal of the imaging element, and in which the solid-state imaging element includes a plurality of semiconductor layers stacked, a plurality of stack-connecting parts for electrically connecting the plurality of semiconductor layers, a pixel array part in which pixel cells that have a photoelectric conversion part and a signal output part are arrayed in a two-dimensional shape, and an output signal line through which signals by the signal output part of the pixel cells are propagated, the plurality of semiconductor layers includes at least a first semiconductor layer and a second semiconductor layer, and, in the first semiconductor layer, the plurality of pixel cells is arrayed in a two-dimensional shape, a signal output part of a pixel group formed with the plurality of pixel cells shares the output signal line wired from the stack-connecting parts, and the output signal line has a separation part which can separate each output signal line that is arbitrarily branched at all or some locations branched from the stack-connecting parts.

According to the technology, it is possible to realize speed-up in driving the output signal line in a pixel in a stacking structure and low power consumption.

BRIEF DESCRIPTION OF THE DRAWINGS

FIGS. 14A to 14D-3 are diagrams illustrating an arrangement example of the pixels, the stack-connecting terminals, and the separation parts in detail according to the fourth embodiment;

FIGS. 15A and 15B are diagrams showing examples in which the elements are arranged so that switches and dummy transistors of the separation parts at branch points hold periodicity;

DETAILED DESCRIPTION OF EMBODIMENTS

Hereinafter, embodiments of the technology will be described in relation to drawings.

Description will be provided in the following order.
1. Example of Overall Configuration of Solid-state Imaging Element
2. Basic Concept of Characteristic Configuration for Adopting Stacking Structure
3. First Embodiment
4. Second Embodiment
5. Third Embodiment
6. Fourth Embodiment
7. Fifth Embodiment
8. Sixth Embodiment
9. Seventh Embodiment
10. Eighth Embodiment
11. Ninth Embodiment
12. Tenth Embodiment (Configuration Example of Camera System)

<1. Example of Overall Configuration of Solid-State Imaging Element>

Figure 6:
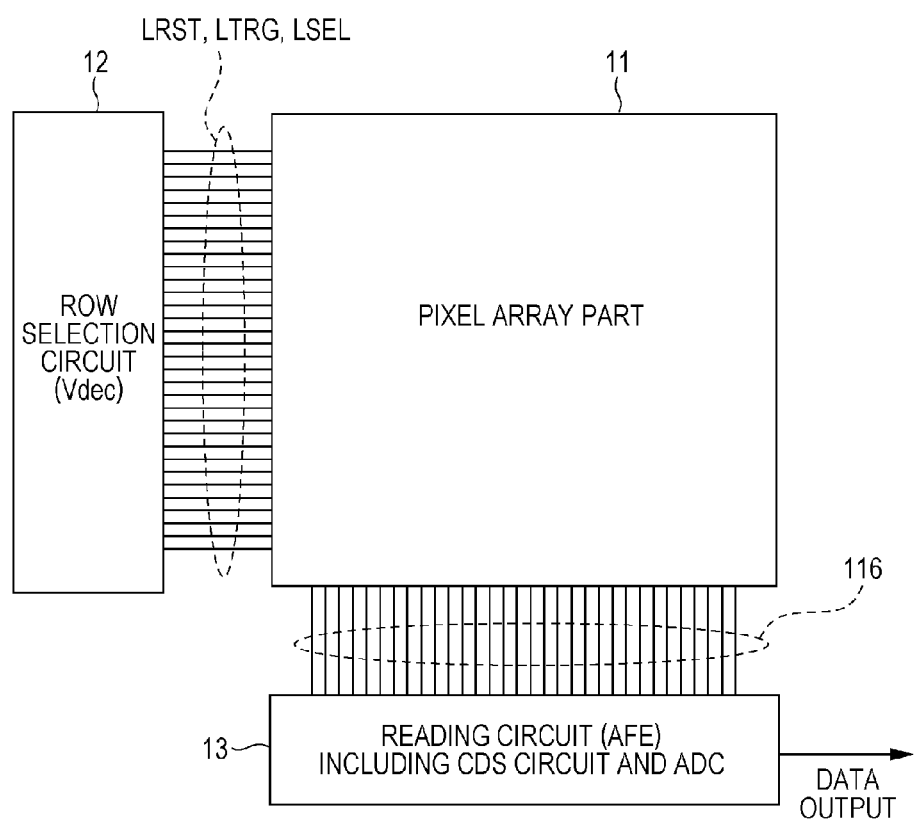
FIG. 6 is a diagram showing a configuration example of a CMOS image sensor (solid-state imaging element) according to an embodiment of the present technology.

FIG. 6 is a diagram showing a configuration example of a CMOS image sensor (solid-state imaging element) according to an embodiment of the technology.

The CMOS image sensor 100 includes a pixel array part 110, a row selection circuit (Vdec) 120 as a pixel driving unit, and a readout circuit (AFE) 130.

In the present embodiment, the opposite side (=rear face) of a face on which transistors are arranged is set to a light-irradiated face as an example, and a plurality of semiconductor layers are stacked and formed so as to read output signals of pixels.

A characteristic configuration corresponding to a stacking structure of the semiconductor layer will be described later.

The pixel array part 110 is arranged with a plurality of pixel cells 110A in a two-dimensional shape (matrix shape) with M rows×N columns.

Figure 7:
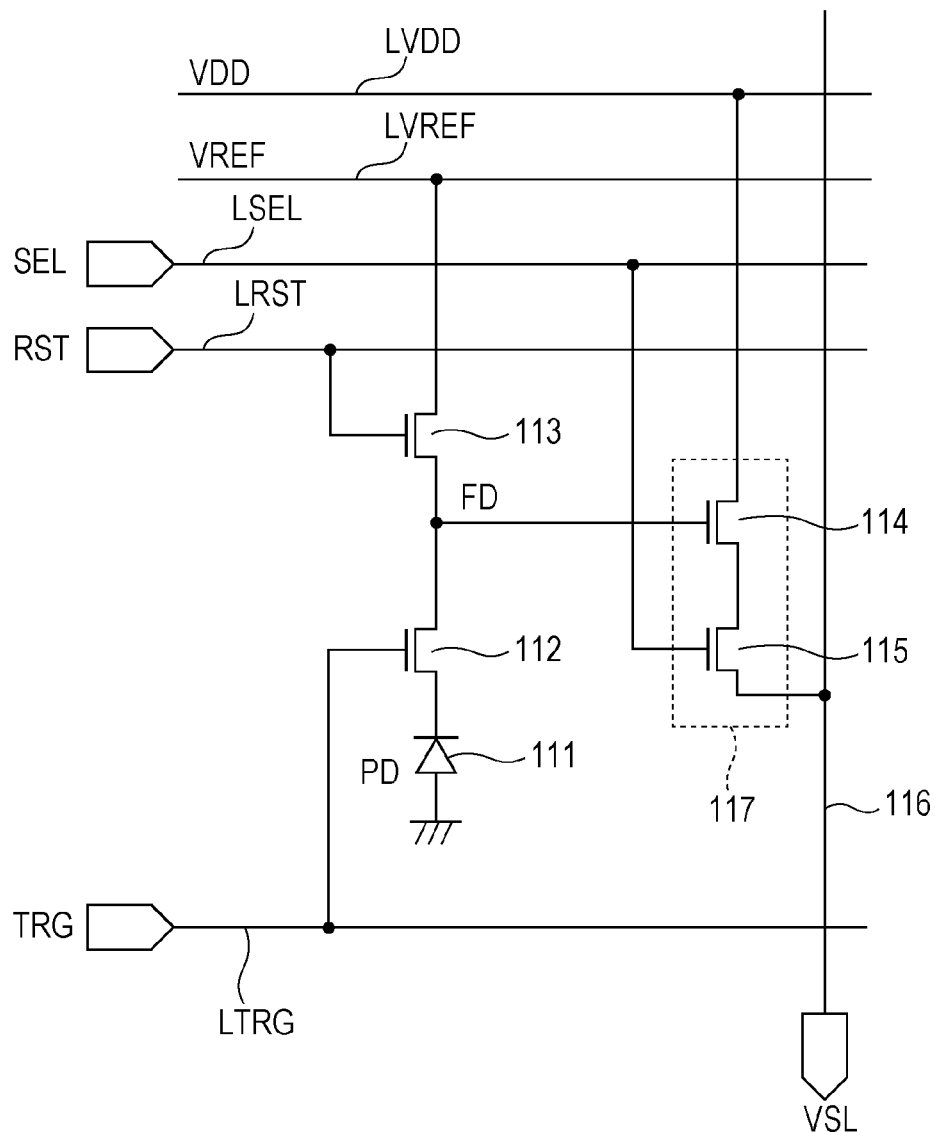
FIG. 7 is a diagram showing an example of a pixel of the CMOS image sensor including four transistors according to the embodiment.

FIG. 7 is a diagram showing an example of a pixel of the CMOS image sensor including four transistors according to the embodiment.

The pixel cell 110A includes a photoelectric conversion unit (photoelectric conversion element) 111 including, for example, a photodiode (PD).

In addition, the pixel cell 110A has four transistors including a transfer transistor 112, a reset transistor 113, an amplifying transistor 114, and a selection transistor 115 as active elements for the one photoelectric conversion unit 111.

The photoelectric conversion unit 111 performs photoelectric conversion for incident light into charges (herein, electrons) in an amount corresponding to the quantity of the light.

The transfer transistor 112 is connected between the photoelectric conversion unit 111 and a floating diffusion FD as an output node, and the gate thereof (transfer gate) is given a transfer signal TRG that is a control signal through a transfer control line LTRG.

Accordingly, the transfer transistor 112 transfers the electrons photoelectrically converted in the photoelectric conversion unit 111 to the floating diffusion FD.

The reset transistor 113 is connected between a power supply line LVREF and the floating diffusion FD, and the gate thereof is given a reset signal RST that is a control signal through a reset control line LRST.

Accordingly, the reset transistor 113 resets the potential of the floating diffusion FD to the potential of the power supply line LVREF.

The floating diffusion FD is connected to the gate of the amplifying transistor 114. The amplifying transistor 114 is connected to an output signal line 116 through the selection transistor 115, and constitutes a source follower as a constant current source outside the pixel part.

An amplifying circuit 117 is formed with the amplifying transistor 114 and the selection transistor 115 as a signal output part.

In addition, a selection signal SEL that is a control signal corresponding to an address signal is given to the gate of the selection transistor 115 through a selection control line LSEL to turn on the selection transistor 115.

If the selection transistor 115 is turned on, the amplifying transistor 114 amplifies the potential of the floating diffusion FD and outputs a voltage corresponding to the potential to the output signal line 116.

The voltage output from each pixel is output to a readout circuit 130 through the output signal line 116.

These operations are simultaneously performed for pixels of one row because, for example, the gates of the transfer transistor 112, the reset transistor 113, and the selection transistor 115 are connected to one another in a row unit.

As described above, the amplifying circuit 117 includes the selection transistor 115 in addition to the amplifying transistor 114, and is connected to the output signal line 116 via the selection transistor 115.

However, it is possible to omit the selection transistor 115 by setting the voltage of the FD of a non-selected pixel to be low by the reset transistor 113 and driving the amplifying transistor 114 to be off.

The reset control line LRST, the transfer control line LTRG, and the selection control line LSEL wired in the pixel array part 110 are wired in a row unit of the pixel array.

The reset control line LRST, the transfer control line LTRG, and the selection control line LSEL are driven by the row selection circuit 120.

The row selection circuit 120 controls an operation of a pixel arranged in an arbitrary row in the pixel array part 110. The row selection circuit 120 functions as a pixel driving unit which controls the driving of a pixel through the control lines LSEL, LRST, and LTRG.

The readout circuit 130 performs a predetermined process for a signal VSL output through the output signal line 116 from each pixel cell 110A in a read row that is selected or pre-selected by driving of the row selection circuit 120, and temporarily retains a pixel signal that is, for example, subjected to a signal processing.

The readout circuit 130 is applicable to a configuration of a circuit including a sample-and-hold circuit that performs sampling and holding for a signal output through the output signal line 116.

Alternatively, the readout circuit 130 includes a sample-and-hold circuit, and is applicable to a configuration of a circuit with a function of removing a reset noise and a fixed-pattern noise specified for a pixel such as unevenness in threshold values of the amplifying transistor 114 by a CDS (Correlated Double Sampling) process.

In addition, the readout circuit 130 is equipped with an analog and digital (AD) converting function, and is applicable to a configuration in which a signal level is set to a digital signal.

Hereinafter, a characteristic configuration corresponding to the stacking structure of a semiconductor layer in the CMOS image sensor 100 according to the embodiment will be described in detail.

<2. Basic Concept of Characteristic Configuration for Adopting Stacking Structure>

First, the basic concept of a characteristic configuration for adopting the stacking structure will be described.

In the CMOS image sensor (solid-state imaging element) 100, basically, a plurality of stacked semiconductor layers is electrically connected to one another with a plurality of stack-connecting terminals (stack-connecting part).

The photoelectric conversion unit 111 and unit pixel cells 110A having signal output parts are two-dimensionally arrayed on a first semiconductor layer.

The signal output parts of a pixel group including a plurality of pixel cells share the output signal line 116 wired from the stack-connecting terminal.

In addition, the output signal line 116 has a separation part which can separate each output signal line 116 that is arbitrarily branched in all or some of the locations branched from the stack-connecting terminal.

More specifically, an output of the amplifying circuit 117 that includes a plurality of amplifying transistors is connected to the stack-connecting terminal, and some or all of branch points between stack-connecting terminals and the amplifying circuits 117 have a separation part which separates the output signal line 116.

The CMOS image sensor (solid-state imaging element) 100 has a light-irradiated face, for example, at the opposite side of the face where transistors and wires are arranged.

In the CMOS image sensor 100, when an output signal is propagated to the first semiconductor layer and a different semiconductor layer that are stacked through stack-connecting terminals, the degree of freedom for arranging the stack-connecting terminals rises, and transistors can be additionally arranged within a pixel array in small numbers without downscaling the photoelectric conversion unit.

By making use of the above advantage, it is possible to reduce the actual load capacity when reading signals of pixels through the amplifying circuit 117, with a separation part such as a switch for separating each branch wiring at a node at which wiring from a stack-connecting terminal to each unit pixel is branched.

In the embodiment, a stack-connecting terminal is characteristic in that the terminal is arranged in the vicinity of the center of the pixel group connected thereto.

Furthermore, the stack-connecting terminal can evenly divide parasitic capacitance of each wiring separated at a separation part by being arranged in the vicinity of the center of the pixel group connected thereto in the range of intervals in which stack-connecting terminals can be satisfactorily arranged.

Accordingly, it is possible to minimize the actual load capacity when reading signals of each pixel through the amplifying circuit 117.

In the embodiment, the branch point is characteristic in that the branch point is arranged in the vicinity of the center of the pixel group which is connected after the branch point.

Furthermore, the branch point can evenly divide parasitic capacitance of each wiring separated at the separation part by arranging the branch point in the vicinity of the center of the pixel group which is connected after the branch point.

Accordingly, it is possible to minimize the actual load capacity when reading signals of each pixel through the amplifying circuit 117.

In the embodiment, the separation part arranged in the branch point is characteristic in that an element same as the separation part is dummy-arranged in an area where a separation part is not arranged so as to have periodicity in arrangement.

Accordingly, it is possible to have periodicity of the layout of pixels and circuits, to have uniform imaging characteristics and operation characteristics of transistors, and to avoid image deterioration such as fixed-pattern noise, or the like.

In the embodiment, the pixel group that is two-dimensionally arrayed is connected to the same stack-connecting terminal.

By connecting the two-dimensionally arrayed pixel group to the same stack-connecting terminal, not only in the row or column direction, it is possible to minimize the distance from a stack-connecting terminal to the furthest pixel even when the number of pixels connected to the stack-connecting terminal is the same.

Accordingly, in the embodiment, it is possible to make voltage drops uniform in readout voltages by parasitic resistance for each pixel.

As a general readout circuit of output signals of pixels, the amplifying transistor 114 in a pixel, and the source follower circuit including a constant current source by the bias transistor connected to the output signal line 116 can be exemplified.

Since the parasitic capacitance of the output signal line 116 is discharged with a constant current, particularly, capacitance components are dominant at a convergence time of output, it is possible to attain speed-up or low power consumption in proportion to the separation of the capacitance.

On the other hand, since what is dominant is capacitive discharge, not a time constant of the wiring, it is characteristic that the convergence time does not dominantly deteriorate by resistance components, and there is almost no overhead incurred by the addition of a switch as a separation part.

On the other hand, uniformity is regarded as important in the resistance components of the output signal line 116. An input voltage of a source follower circuit is output to a source terminal of the amplifying transistor 114.

For this reason, the output voltage in the stack-connecting terminal is offset by a product of wiring resistance from the amplifying transistor 114 to the stack-connecting terminal as an output terminal and a constant current generated in the load MOS (bias transistor) that is the current source.

The offset voltage can be easily cancelled by a CDS unit such as a correlated double sampling, but if the voltage differs for each pixel, a sufficient margin is necessary for a voltage range that can be input to an analog signal processing circuit such as an analog and digital conversion circuit after the output terminal.

In the embodiment, since a switch as a separation means in the branch point is added to each separated output signal line 116, it is characteristic that uniformity of resistance components of the output signal line 116 is not impaired.

Next, specific configuration examples will be described.

<3. First Embodiment>

Figure 8:
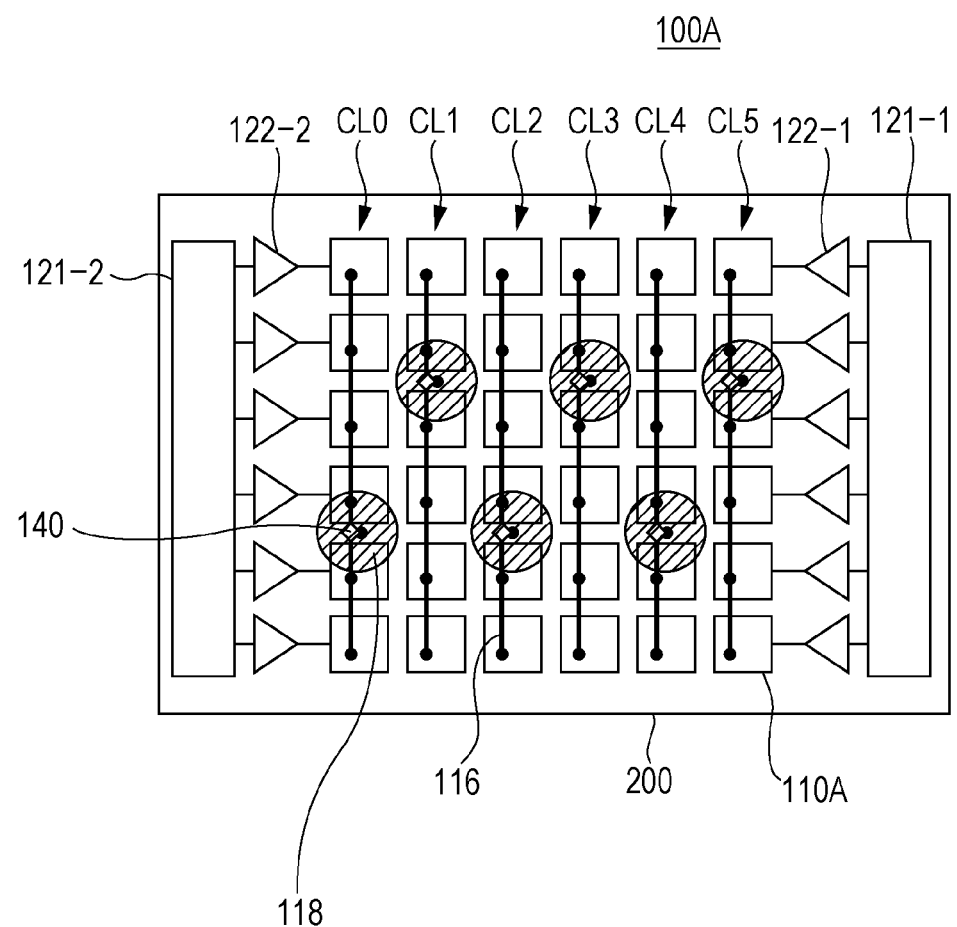
FIG. 8 is a diagram showing an arrangement example of pixels, stack-connecting terminals, and separation parts in a first semiconductor layer of a CMOS image sensor (solid-state imaging element) according to a first embodiment of the technology.

FIG. 8 is a diagram showing an arrangement example of pixels, stack-connecting terminals, and separation parts in a first semiconductor layer of a CMOS image sensor (solid-state imaging element) according to a first embodiment of the technology.

Figure 9:
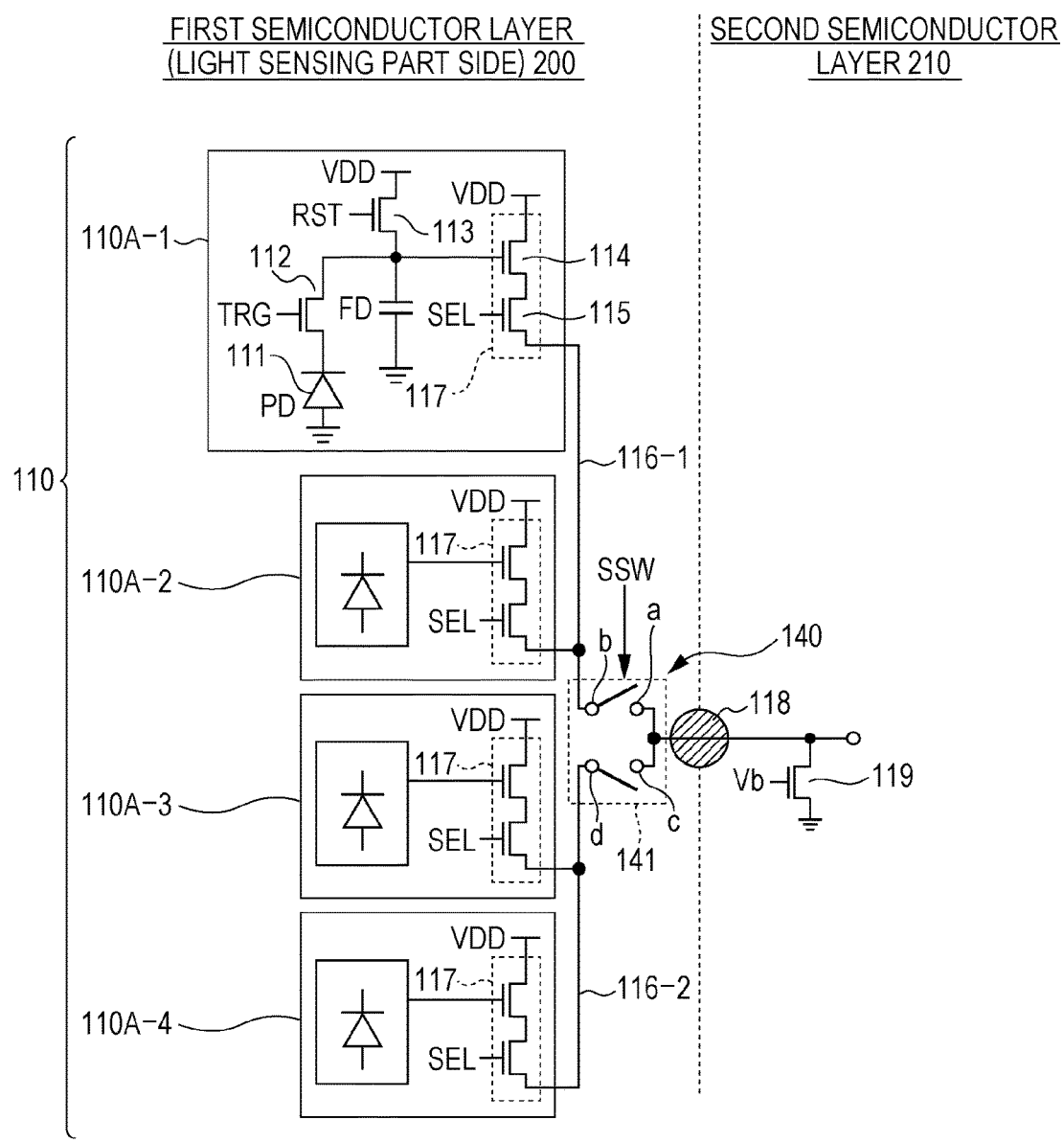
FIG. 9 is a diagram showing an example of principal circuits of the CMOS image sensor (solid-state imaging element) of FIG. 8.

FIG. 9 is a diagram showing an example of principal circuits of the CMOS image sensor (solid-state imaging element) of FIG. 8.

In the CMOS image sensor 100A of the first embodiment, pixel cells 110A are arranged on a first semiconductor layer 200 in an array shape. Row scanning circuits 121-1 and 121-2 are arranged on the both sides of the pixel array part 110, and pixel driving circuits 122-1 and 122-2 are arranged corresponding to rows of the pixel cells 110A.

In the first embodiment, an amplifying circuit 117 of the pixel cell 110A shares the output signal lines 116 in the column direction and is connected to a stack-connecting terminal 118.

A separation part 140 of the output signal line 116 is provided on a location where the output signal line 116 branches between the stack-connecting terminal 118 and the amplifying circuit 117 of each pixel cell.

In the pixel array part 110 of FIG. 8, pixel cells are arranged in a 6×6 matrix shape.

In the first embodiment, it is preferable that the stack-connecting terminal 118 may be arranged at the center of a pixel group of a plurality of pixel cells 110A connected thereto in the range of a minimum interval between stack-connecting terminals that can be produced.

In this case, ideally, it is preferable that the stack-connecting terminals 118 are positioned in between the formation locations of the third and fourth pixel cells in columns CL0 to CL5, that is, at the center of each column, in the pixel array of FIG. 8.

When center arrangement is not possible, it is preferable to arrange the stack-connecting terminals in the vicinity of the center within the range where the terminals can be arranged as shown in FIG. 8.

In FIG. 8, the stack-connecting terminals 118 are arranged in between the formation locations of the fourth and the fifth pixel cells, that is, in the vicinity of the center within the range where the terminals can be arranged, in the even columns CL0, CL2, and CL4.

The stack-connecting terminals 118 are arranged in between the formation locations of the second and the third pixel cells, that is, in the vicinity of the center within the range where the terminals can be arranged, in the odd columns CL1, CL3, and CL5.

In the example of FIGS. 8 and 9, the separation part 140 is arranged so as to be separated in the stacking direction and to overlap the stack-connecting terminal 118.

Furthermore, FIG. 9 includes four pixel cells 110A-1 to 110A-4 for simplification, and shows an example where the stack-connecting terminal 118 and the separation part 140 are arranged substantially at the center of the pixel group.

As shown in FIG. 9, the separation part 140 at the branch point includes a switch 141, and separates the output signal line 116 into two output signal line 116-1 and 116-2.

The output signal line 116-1 is connected to the amplifying circuits 117 of the pixel cells 110A-1 and 110A-2 and the output signal line 116-2 is connected to the amplifying circuits 117 of the pixel cells 110A-3 and 110A-4.

The switch 141 that constitutes the separation part 140 includes a pair of terminals a and b and a pair of terminals c and d.

The terminal a is connected to the stack-connecting terminal 118 and the terminal b is connected to the one output signal line 116-1.

The terminal c is connected to the stack-connecting terminal 118 and the terminal d is connected to the other output signal line 116-2.

With the switch 141 of the above configuration, the terminals a and b and the terminals c and d are switched to a connection or non-connection state according to a switching signal SSW by a control system that is not shown in the drawing.

The switch 141 can be realized with a sample circuit in which either or both a NMOS transistor and a PMOS transistor are connected thereto in parallel, or the like.

In the example of FIG. 9, a bias transistor (load MOS) 119 which functions as a constant current source of the source follower is formed on the second semiconductor layer 210.

The bias transistor 119 has a function of inputting a bias voltage Vb to a gate so that a constant current flows from the output signal line 116.

The bias transistor 119 may be arranged in the first semiconductor layer 200.

<4. Second Embodiment>

Figure 10:
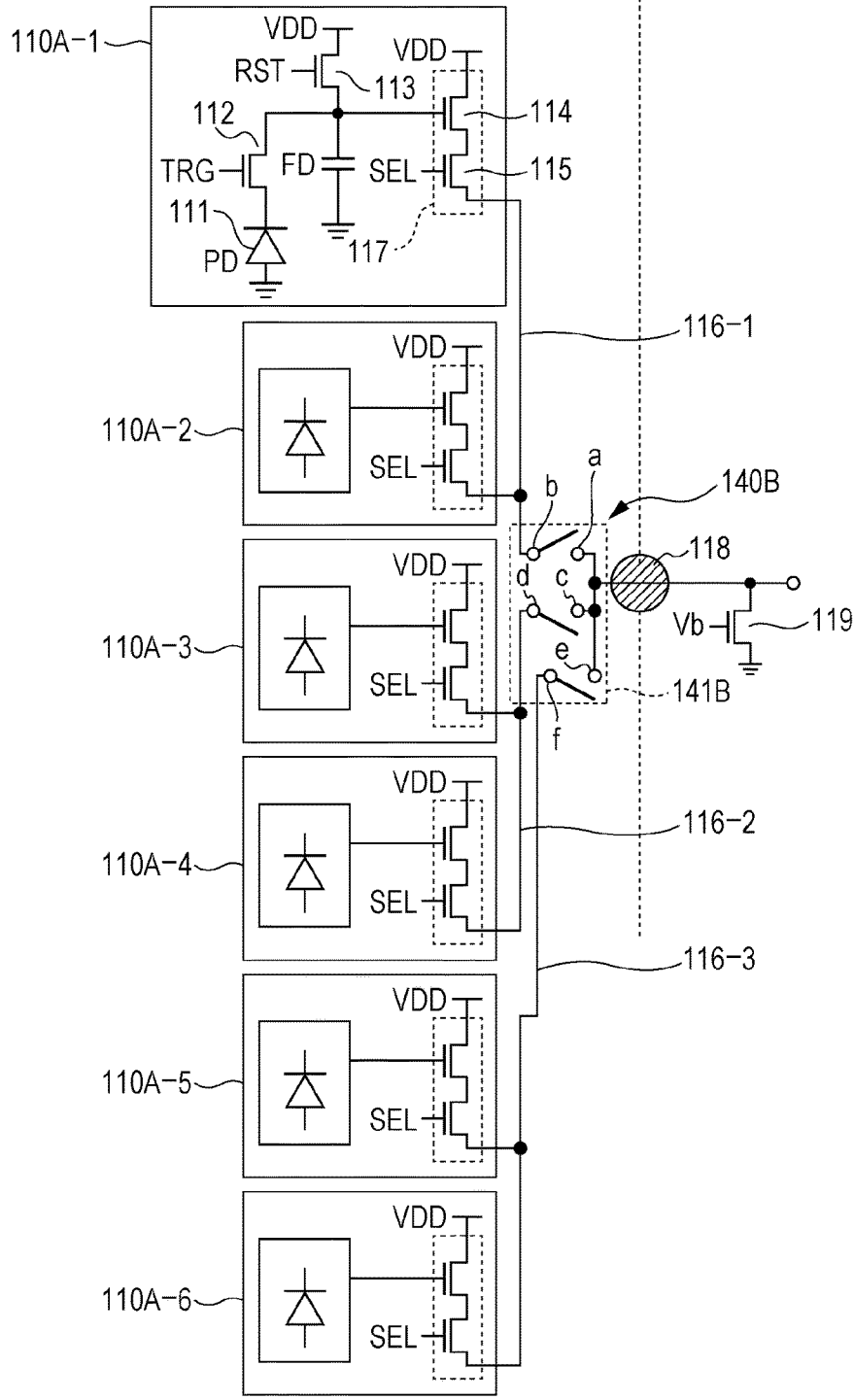
FIG. 10 is a diagram showing an example of principal circuits of a CMOS image sensor (solid-state imaging element) according to a second embodiment of the technology.

FIG. 10 is a diagram showing an example of principal circuits of a CMOS image sensor (solid-state imaging element) according to a second embodiment.

A point that the CMOS image sensor 100B according to the second embodiment differs from the CMOS image sensor 100A according to the first embodiment is that the number of branches of the output signal line 116 by a separation part 140B is not two but more than that (herein, three branches).

In the CMOS image sensor 100B, the output signal line 116 is branched into three output signal lines 116-1, 116-2, and 116-3.

In addition, the amplifying circuits 117 of the pixel cells 110A-5 and 110A-6 are connected to the output signal line 116-3.

A switch 141B includes a pair of terminals e and f in addition to the configuration of FIG. 9.

In addition, the terminal e is connected to the stack-connecting terminal 118 and the terminal f is connected to the output signal line 116-3.

With the switch 141B of the above configuration, the terminals a and b, the terminals c and d, and the terminals e and f are switched to a connection or non-connection state according to a switching signal SSW by a control system that is not shown in the drawing.

<5. Third Embodiment>

Figure 11:
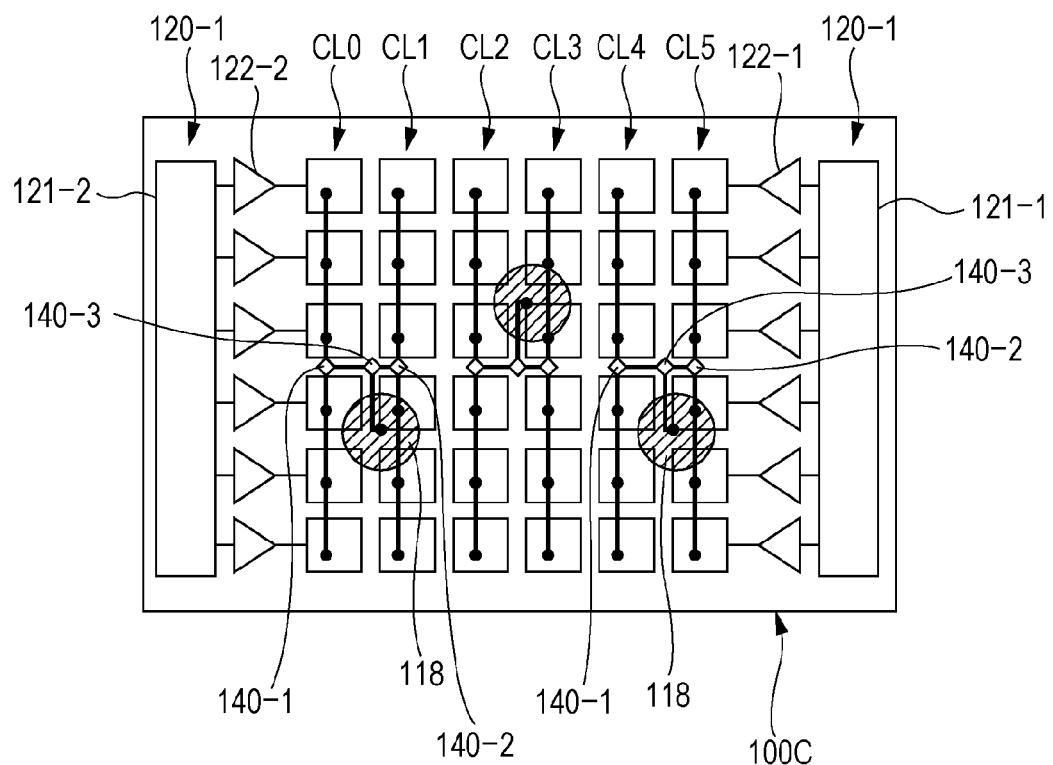
FIG. 11 is a diagram showing an arrangement example of pixels, stack-connecting terminals, and separation parts in a first semiconductor layer of a CMOS image sensor (solid-state imaging element) according to a third embodiment of the technology.

FIG. 11 is a diagram showing an arrangement example of pixels, stack-connecting terminals, and separation parts on a first semiconductor layer of a CMOS image sensor (solid-state imaging element) according to a third embodiment of the technology.

Figure 12:
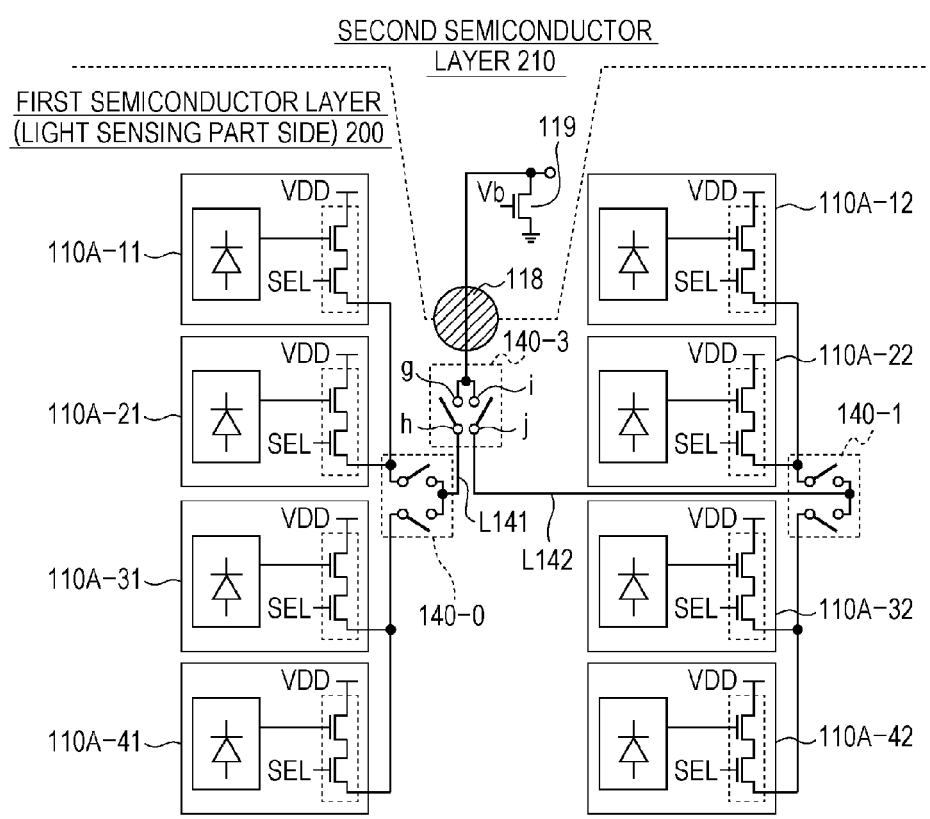
FIG. 12 is a diagram showing an example of principal circuits of a CMOS image sensor (solid-state imaging element) according of FIG. 11.

FIG. 12 is a diagram showing an example of principal circuits of the CMOS image sensor (solid-state imaging element) of FIG. 11.

The CMOS image sensor 100C according to the third embodiment is configured to have pixel groups sharing the stack-connecting terminals 118, including pixels arranged perpendicular (the horizontal direction in FIG. 11) to the readout scanning direction of pixels (the vertical direction in FIG. 11).

In the example of FIG. 11, each of two columns of the zeroth and the first columns, the second and the third columns, and the fourth and the fifth columns shares one stack-connecting terminal 118.

In addition, an output line L141 which extends from the output of the separation part 140-1 that is arranged in the middle of the even-numbered column and an output line L142 wired so as to return to the even-numbered column side from the output of the separation part 140-2 in the odd-numbered column side are connected to the separation part 140-3 arranged at a first branch point.

The separation parts 140-0 and 140-1 form a second branch point, and basically have the same configuration as in the first embodiment.

A switch 141-3 constituting the separation part 140-3 at the first branch point includes a pair of terminals g and h, and a pair of terminals i and j.

The terminal g is connected to the stack-connecting terminal 118 and the terminal h is connected to the one output line L141.

The terminal i is connected to the stack-connecting terminal 118 and the terminal j is connected to the other output line L142.

With the switch 141-3 of the above configuration, the terminals g and h and the terminals i and j are switched to a connection or non-connection state according to a switching signal SSW by a control system that is not shown in the drawing.

In the third embodiment, the first separation part 140-3 is positioned at the first branch point that branches first from the stack-connecting terminal 118 and the second separation parts 140-1 and 140-2 are positioned at the second branch point that branches after that.

A plurality of pixels included in the same pixel group is simultaneously selected by readout scanning, but any one of the pixels that is simultaneously selected is connected to the stack-connecting terminal 118 by the first or the second separation part.

In the example of FIG. 12, the number of pixel cells connected to the stack-connecting terminal 118 during reading of pixels is reduced to one fourth of a case where a separation part is not provided, whereby it is possible to speed-up and low power consumption by a decrease in parasitic capacitance.

In the example of FIG. 12, both the first and the second branch points have separation parts, but it does not matter that either of the branch points has a separation part.

For example, when only the first branch point is provided with a separation part, it is possible to reduce the total parasitic capacitance of the output signal line 116 by half.

When a separation part is arranged only at the two second branch points, it is possible to reduce the number of connected pixel cells by one fourth by connecting any one of four switches arranged at the branch points.

When parasitic capacitance of wiring from the first branch point to the second branch points is sufficiently smaller than the parasitic capacitance after the second branch points, substantially the same effect is obtained even when the separation part 140-3 at the first branch point is omitted.

On the contrary, when parasitic capacitance of wiring from the first branch point to the second branch points is greater, it is preferable to have a separation part at the first branch point also.

<6. Fourth Embodiment>

Figure 13:
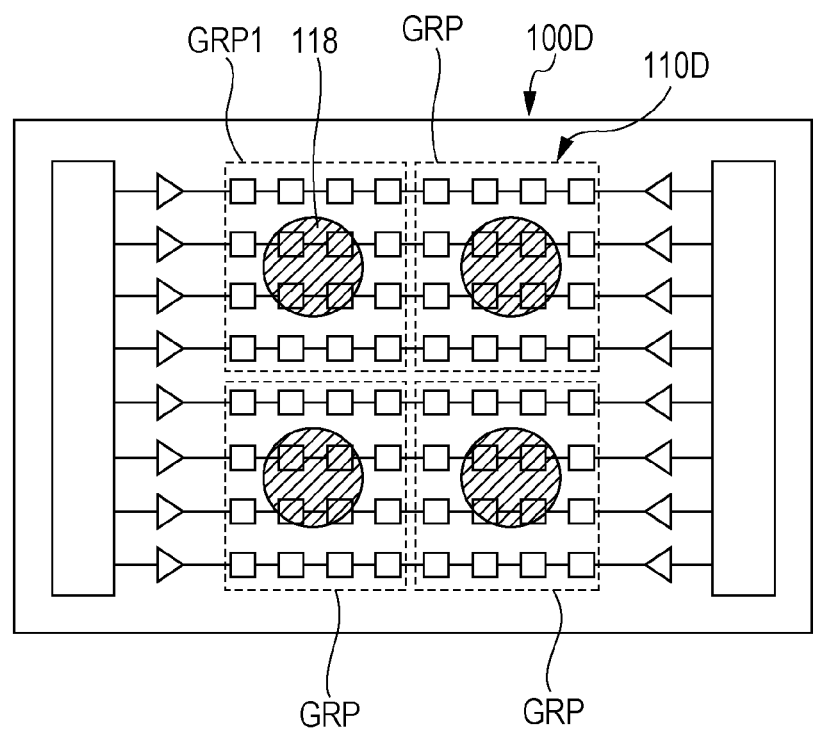
FIG. 13 is a diagram showing an arrangement example of pixels, stack-connecting terminals, and separation parts in a first semiconductor layer of a CMOS image sensor (solid-state imaging element) according to a fourth embodiment of the technology.

FIG. 13 is a diagram showing an arrangement example of pixels, stack-connecting terminals, and separation parts on a first semiconductor layer of a CMOS image sensor (solid-state imaging element) according to a fourth embodiment of the technology.

FIGS. 14A to 14D-3 are diagrams illustrating an arrangement example of the pixels, the stack-connecting terminals, and the separation parts in detail according to the fourth embodiment.

In a pixel array part 110D of FIG. 13, pixel cells are arranged in a 6×6 matrix shape.

In addition, FIG. 13 shows an arrangement example when a 4×4 pixel cell group GRP shares one stack-connecting terminal 11 as an example.

In order to minimize the length of wiring to the furthest pixel, it is preferable to arrange the stack-connecting terminal 118 in the vicinity of the center of the 4×4 pixel cell group GRP.

Furthermore, it is preferable to arrange the first branch point at which the first separation part 140-3 is arranged in the vicinity of the center of the pixel cell group GRP, as shown in FIG. 14A.

Furthermore, as shown in FIG. 14B, the second separation parts 140-1 and 140-2 of the second branch point are arranged around of the center of each pixel cell group GRP separated by the first branch point.

In the same manner, as shown in FIG. 14C, a third separation part 140-4 of a third branch point is arranged around the center of each pixel cell group GRP separated by the second branch points 140-1 and 140-2.

As a result, the configuration of the arrangement of the separation parts and the output single lines 116 as shown in FIG. 14D is preferable to minimize wiring capacity or wiring resistance.

However, there is no strict limitation on the center arrangement due to the degree of complexity in the arrangement and wiring of transistors, but satisfactory effects are obtained if the separation parts are arranged in the vicinity of the center within a viable range.

Figure 1:
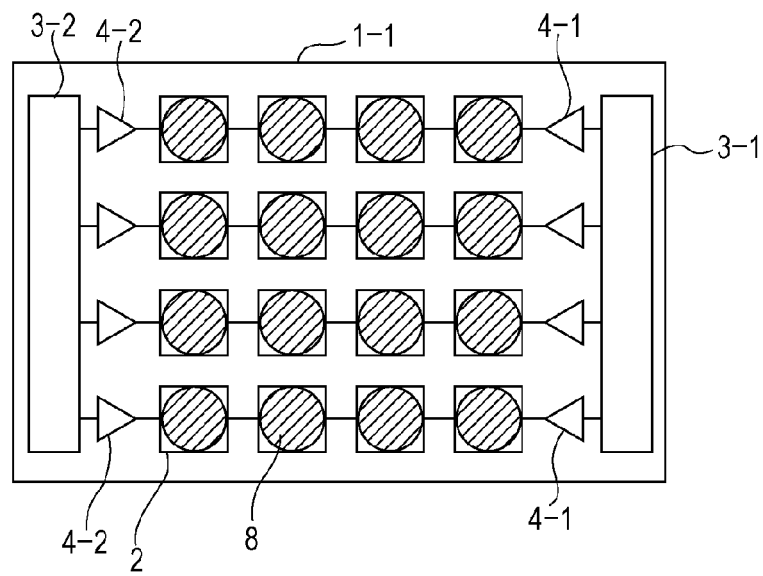
FIG. 1 is a diagram showing a basic configuration of a solid-state imaging element disclosed in Japanese Unexamined Patent Application Publication No. 2006-049361.
Figure 2:
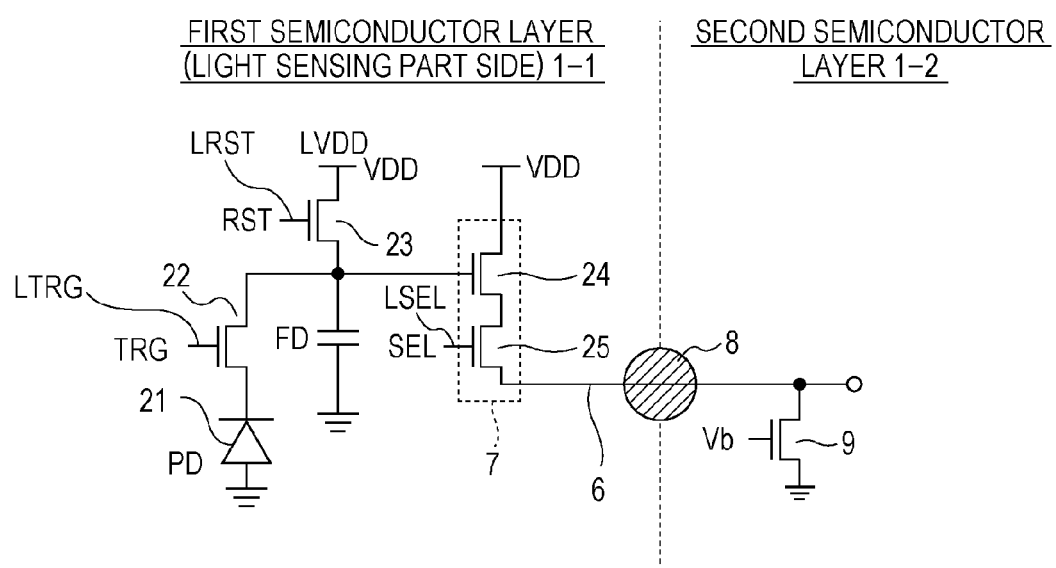
FIG. 2 is a diagram showing an example of a pixel of a CMOS image sensor including four transistors.

In addition, as shown in FIG. 14D-2, it is preferable to arrange a dummy transistor DMT as a dummy element at a location where separation means is not arranged in consideration of periodicity in the arrangement of the separation means.

By maintaining periodicity in the formation of transistors of each pixel cell, characteristics of light sensing elements and transistors are uniformed and the occurrence of fixed-pattern noise is suppressed.

Figure 3:
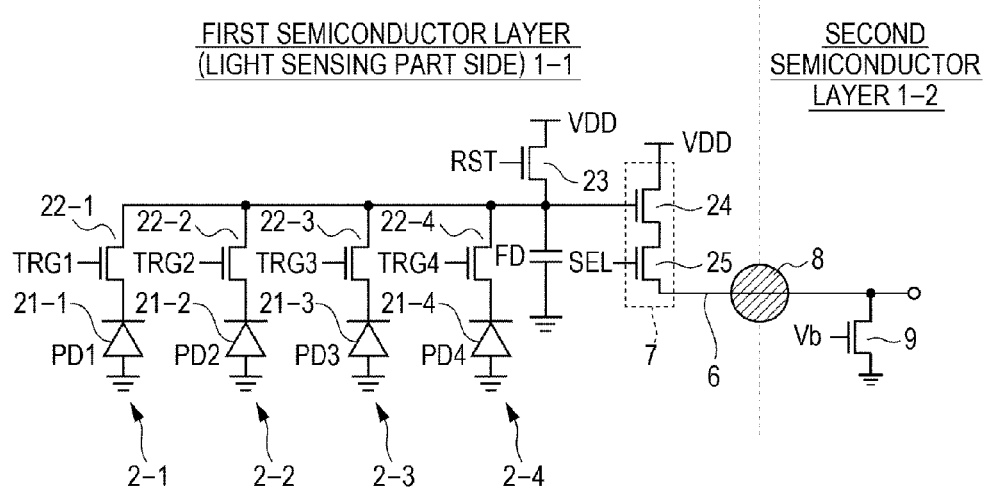
FIG. 3 is a diagram showing an example of pixel sharing of a CMOS image sensor.
Figure 4:
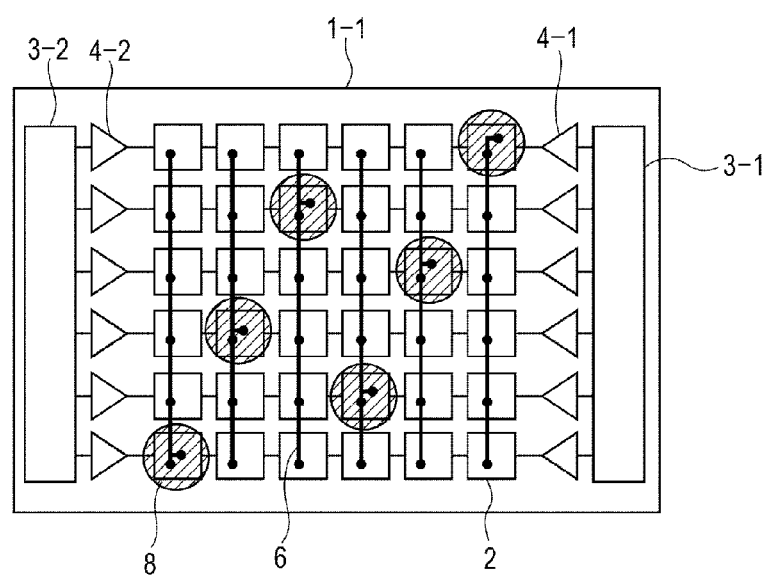
FIG. 4 is a diagram showing a configuration example of a solid-state imaging element in which the output of amplifying circuits of a plurality of pixel cells shares an output signal line connected to stack-connecting terminals.
Figure 5:
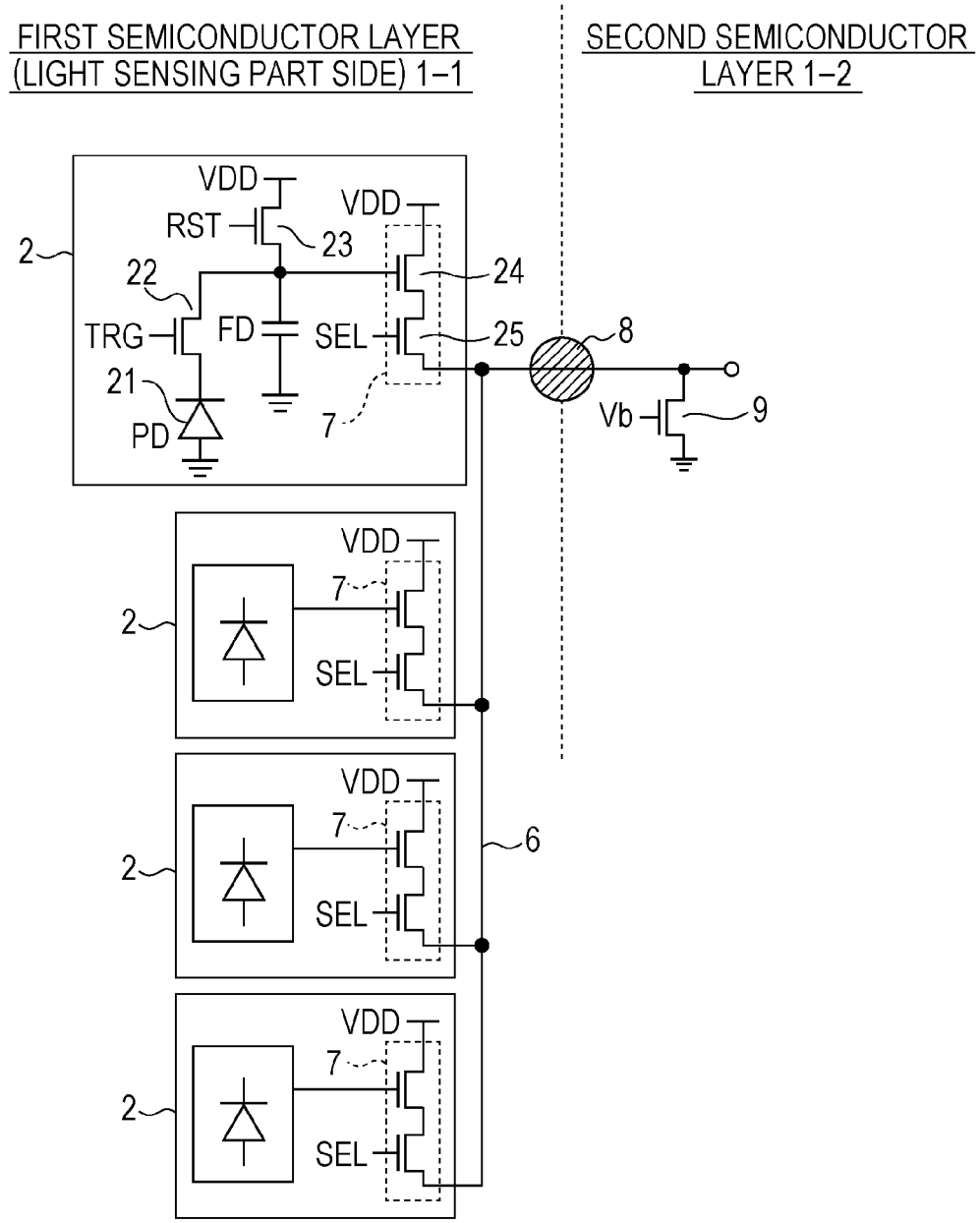
FIG. 5 is a diagram showing an example of principal circuits of the solid-state imaging element of FIG. 4.

Furthermore, as shown in FIG. 14D-3, it does not matter that separation parts are omitted at some branch points, and replaced with the dummy transistor DMT.

In this example, the dummy transistors DMT are arranged instead of the second separation parts 140-1 and 140-2.

FIGS. 15A and 15B are diagrams showing an example in which elements are arranged so that switches of separation parts at branch points and dummy transistors hold periodicity.

FIGS. 15A and 15B are circuit diagrams corresponding to FIG. 14D-3, and the elements are arranged therein so that the switches of the separation parts at the branch points and the dummy transistors hold periodicity.

The dummy transistor DMT of FIG. 15B is configured such that, as an example, the gates, the drains, and the sources of two NMOS transistors NT1 and NT2 which form the switch of the separation part and are cascade-connected to each other are grounded.

Figure 16:
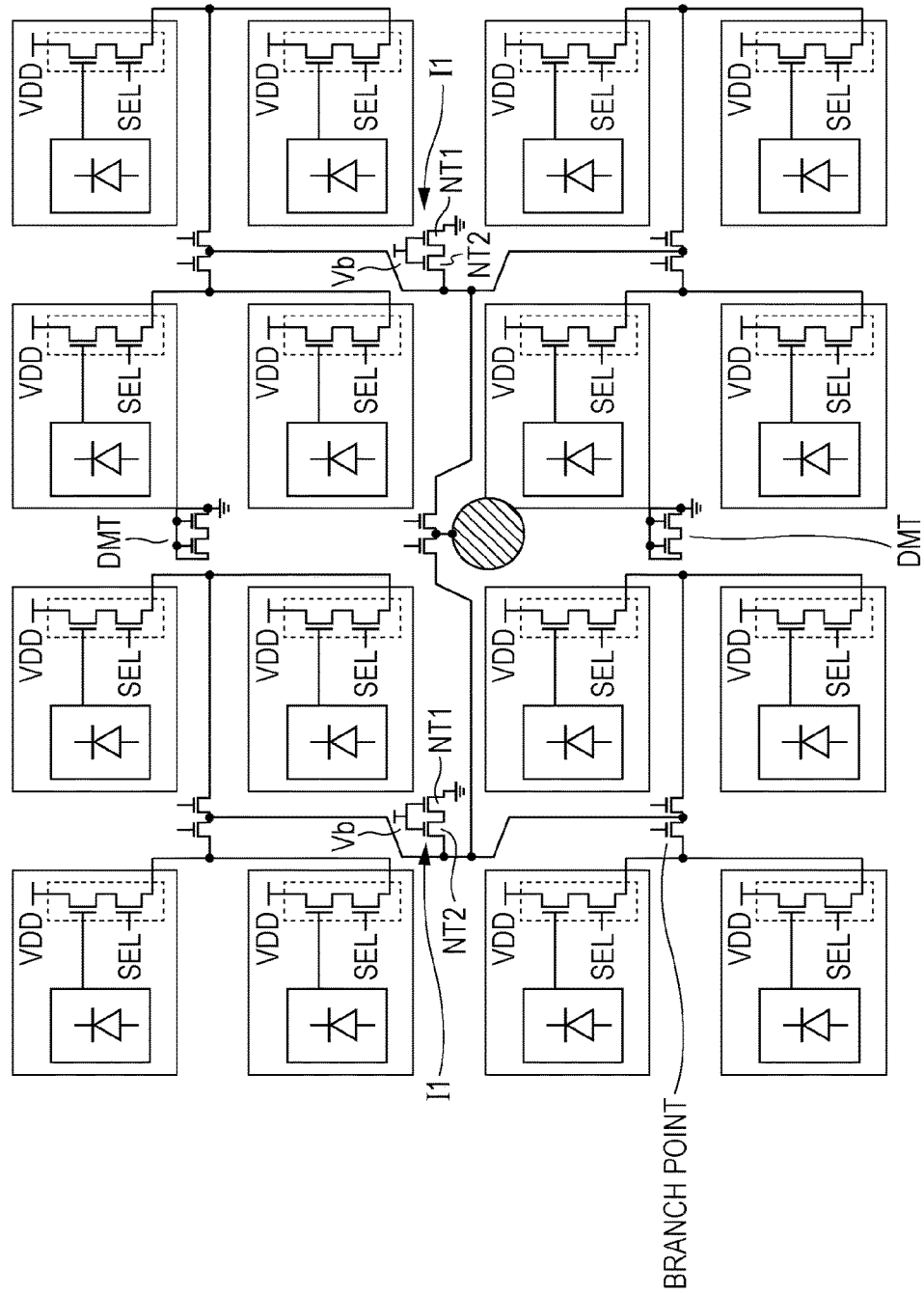
FIG. 16 is a diagram showing an example in which the elements are arranged so that switches and dummy transistors of the separations part at branch points hold periodicity, and the dummy transistors have a predetermined function.

FIG. 16 is a diagram showing an example in which elements are arranged so that the switches of the separation parts at the branch points and the dummy transistors hold periodicity and the dummy transistors have a predetermined function.

As shown in FIG. 16, the dummy transistor DMT can be configured to have any function.

In the example of FIG. 16, the dummy transistor DMT is caused to function as a constant current source I1 of a source follower.

Specifically, the source of the NMOS transistor NT1 is grounded, the drain of the NMOS transistor NT2 is connected to the output signal line 116, and the gates of both NMOS transistors NT1 and NT2 are connected to the power supply for the bias voltage Vb to constitute the constant current source I1.

Figure 17:
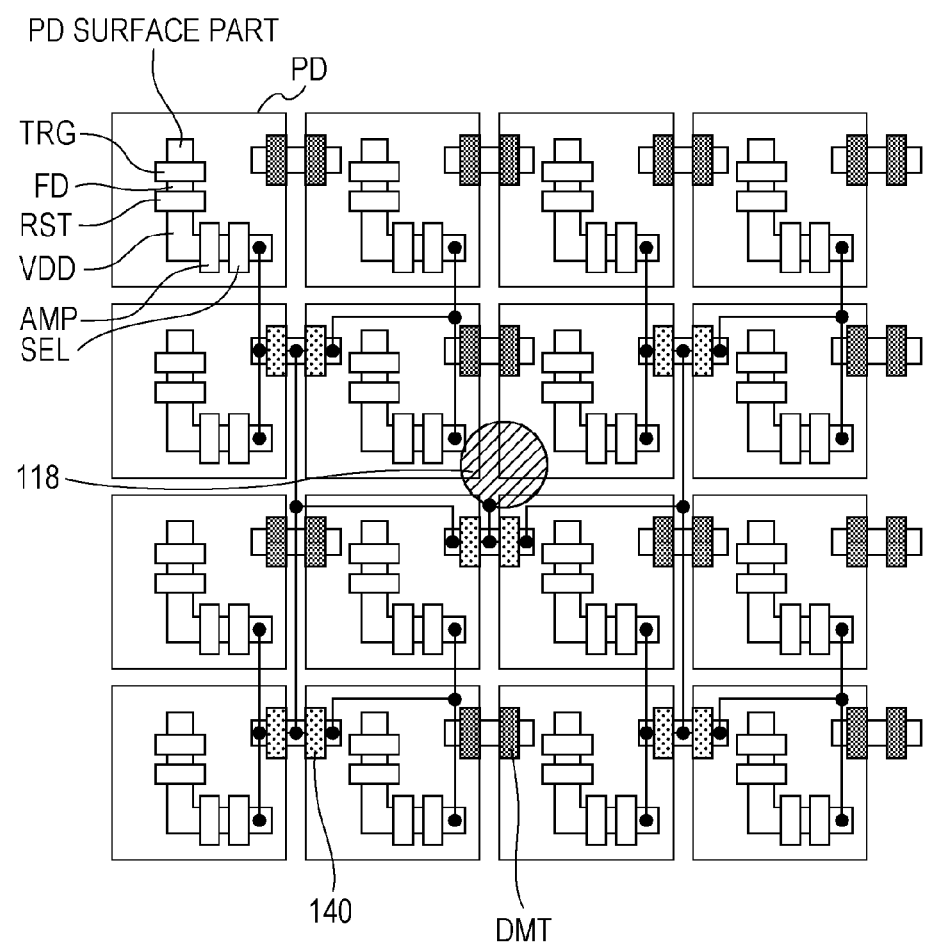
FIG. 17 is a diagram showing a layout example when a stack-connecting terminal is shared in 4×4 pixel cells.

FIG. 17 is a diagram showing a layout example when a 4×4 pixel cells share the stack-connecting terminal.

When the 4×4 pixel cells share the stack-connecting terminal 118, as shown in FIG. 17, for example, it is possible to arrange the separation part 140 in a gap between the pixel cells 110A.

Particularly, it is possible to arrange a separation part without reducing the area of a light sensing part in a rear surface irradiation type image sensor in which photoelectric conversion is performed by irradiating a surface opposite to a transistor-arranged surface with light, or an image sensor in which a photoelectric conversion film is formed upper than a wiring layer.

<7. Fifth Embodiment>

Figure 18:
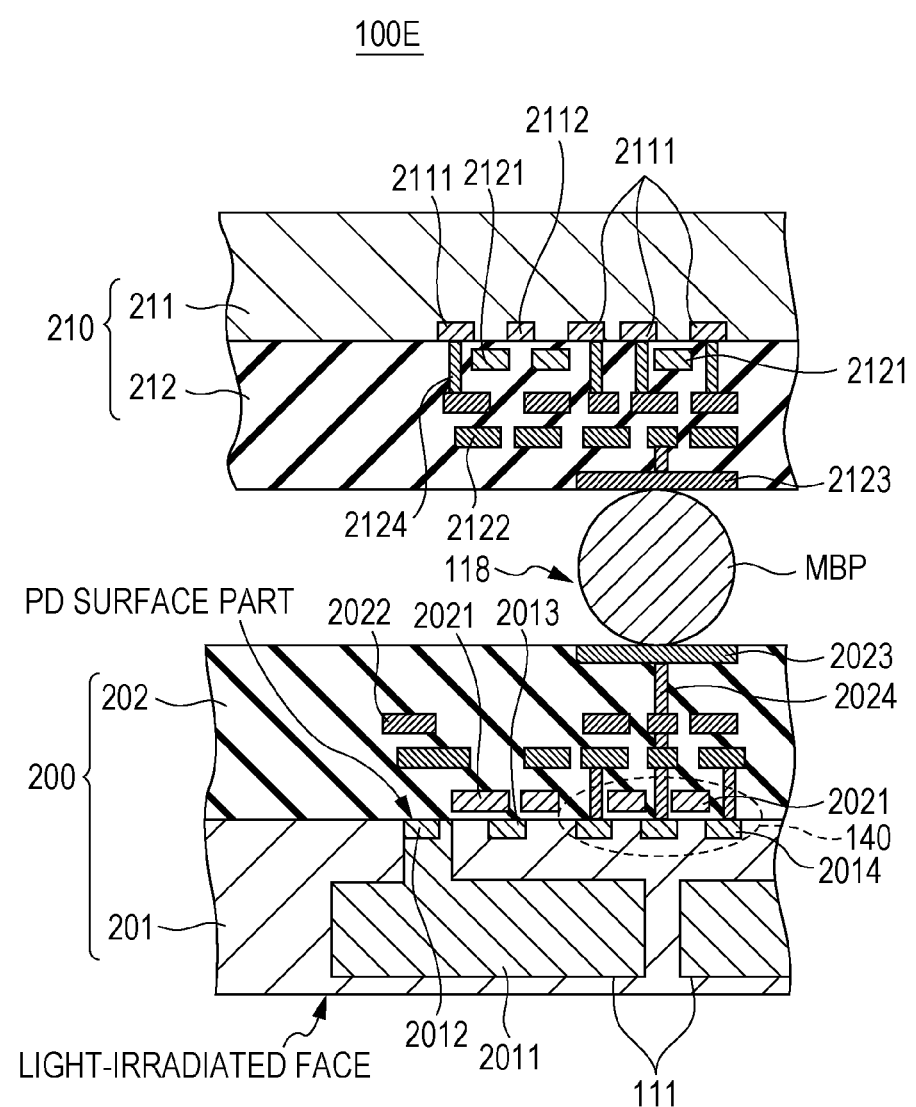
FIG. 18 is a diagram showing a stacking structure example of a first semiconductor layer and a second semiconductor layer of a CMOS image sensor (solid-state imaging element) according to a fifth embodiment of the technology.

FIG. 18 is a diagram showing a stacking structure example of a first semiconductor layer and the second semiconductor layer of a CMOS image sensor (solid-state imaging element) according to a fifth embodiment of the technology.

In the first semiconductor layer 200, a wiring layer 202 is formed on a silicon (Si) substrate (p-well) 201.

An n-type diffusion region 2011 is formed on the Si substrate 201 as a photoelectric conversion unit (PD) 111, and a p+ type diffusion region 2012 is formed over the surface part of the photoelectric conversion unit 111 (the boundary between the wiring layer 202).

n+ diffusion regions 2013 of FDs and n+ diffusion regions 2014 of the transistors for the switches of the separation parts 140 are formed in plural over the surface part in the Si substrate 201.

In the wiring layer 202, a gate wiring 2021 and a signal propagation wiring 2022 of each transistor are formed in an insulating layer such as SiO$_2$, and a micro-pad 2023 formed of Cu, or the like is formed over the surface part thereof.

In addition, a via (VIA) 2024 is formed in the wiring layer 202 in order to connect a n+ diffusion region 2014 of the separation part 140 to the micro-pad 2023.

In the second semiconductor layer 210, a wiring layer 212 is formed on a Si substrate 211.

Diffusion regions 2111 and 2112 of transistors are formed in the surface part on the Si substrate 211.

In the wiring layer 212, a gate wiring 2121 and a signal propagation wiring 2122 of each transistor are formed in an insulating layer such as SiO$_2$, and a micro-pad 2123 formed of Cu, or the like is formed over the surface part thereof.

In addition, a via (VIA) 2124 is formed in the wiring layer 212 in order to connect a diffusion region 2111 and the like to a micro-pad 2123.

A CMOS image sensor (solid-state imaging element) 100E of FIG. 18 is an image sensor in which the photoelectric conversion unit 111 is formed on the semiconductor face opposite to the transistors and the wiring layers and the rear surface is irradiated with light, using a micro-bump BMP as the stack-connecting terminal 118.

In the image sensor 100E, the surface part of the wiring layer 202 of the first semiconductor layer 200 and the surface part of the wiring layer 212 of the second semiconductor part 210 are opposed to each other to connect the micro-pad 2023 and the micro-pad 2123 with the micro-bump BMP.

<8. Sixth Embodiment>

Figure 19:
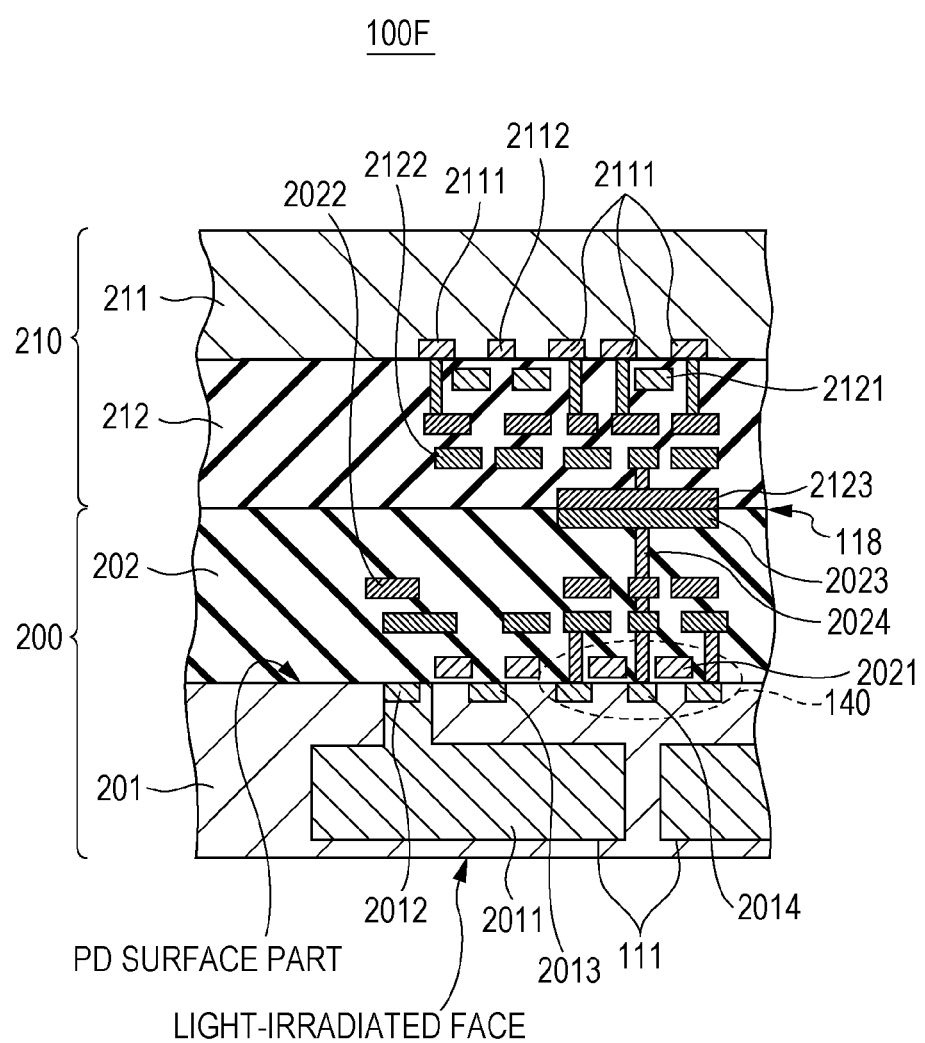
FIG. 19 is a diagram showing a stacking structure example of a first semiconductor layer and a second semiconductor layer of a CMOS image sensor (solid-state imaging element) according to a sixth embodiment of the technology.

FIG. 19 is a diagram showing a stacking structure example of a first semiconductor layer and a second semiconductor layer of a CMOS image sensor (solid-state imaging element) according to a sixth embodiment of the technology.

A point that an image sensor 100F according to the sixth embodiment differs from the image sensor 100E according to the fifth embodiment is that the micro-pad 2023 and the micro-pad 2123 as the uppermost wiring are connected to each other without using a micro-bump.

<9. Seventh Embodiment>

Figure 20:
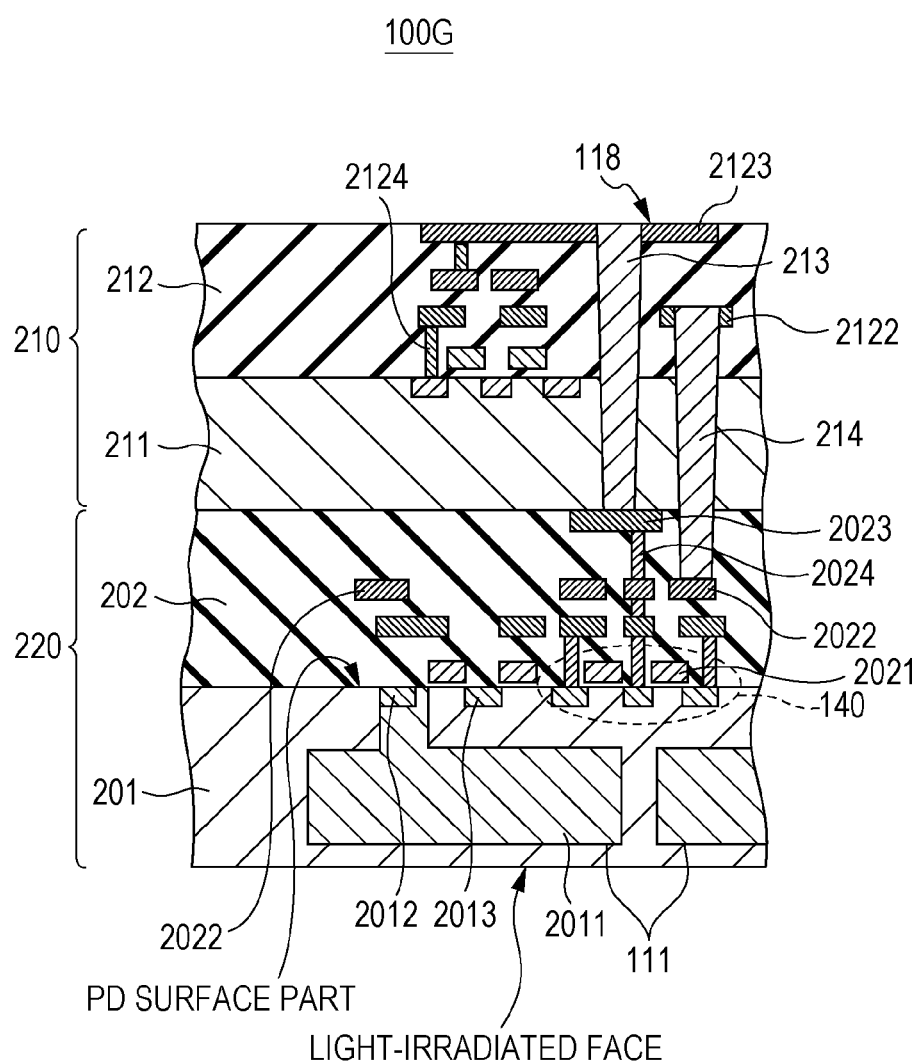
FIG. 20 is a diagram showing a stacking structure example of a first semiconductor layer and a second semiconductor layer of a CMOS image sensor (solid-state imaging element) according to a seventh embodiment of the technology.

FIG. 20 is a diagram showing a stacking structure example of a first semiconductor layer and a second semiconductor layer of a CMOS image sensor (solid-state imaging element) according to a seventh embodiment of the technology.

Point that an image sensor 100G according to the seventh embodiment differs from the image sensor 100F according to the sixth embodiment are as follows.

In the image sensor 100G, the Si substrate 211 of the second semiconductor layer 210 is arranged in the surface side of the wiring 202 of the first semiconductor layer 200.

In addition, the micro-pad 2123 of the wiring layer 212 of the second semiconductor layer 210 is connected to the micro-pad 2023 of the wiring layer 202 of the first semiconductor layer 200 by a through hole VIA electrode 213 that penetrates the second semiconductor layer 210.

Furthermore, the wiring 2122 of the wiring layer 212 of the second semiconductor layer 210 is connected to the wiring 2022 of the wiring layer 202 of the first semiconductor layer 200 by a through hole VIA electrode 214 that penetrates the second semiconductor layer 210.

<10. Eighth Embodiment>

Figure 21:
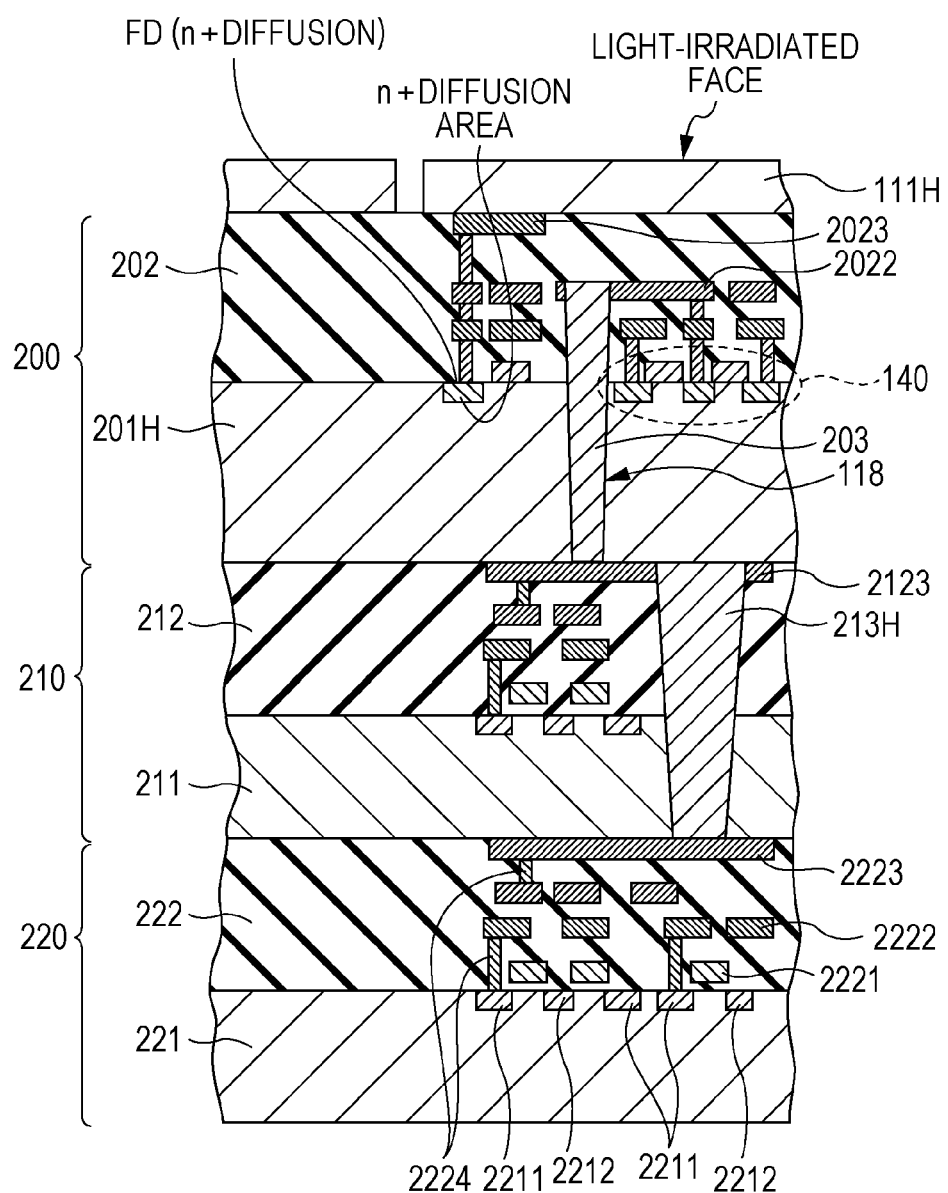
FIG. 21 is a diagram showing a stacking structure example of a first semiconductor layer, a second semiconductor layer, and a third semiconductor layer of a CMOS image sensor (solid-state imaging element) according to a eighth embodiment of the technology.

FIG. 21 is a diagram showing a stacking structure example of a first semiconductor layer, a second semiconductor layer, and a third semiconductor layer of a CMOS image sensor (solid-state imaging element) according to an eighth embodiment of the technology.

The CMOS image sensor 100H according to the eighth embodiment has a stacking structure of the first semiconductor layer 200, the second semiconductor layer 210, and a third semiconductor layer 230.

In the third semiconductor layer 230, a wiring layer 222 is formed on a Si substrate 221.

On the Si substrate 221, diffusion regions 2211 and 2212 of transistors are formed in the surface part.

In the wiring layer 222, a gate wiring 2221 and a signal propagation wiring 2222 of each transistor are formed in an insulating layer such as $SiO_2$, and a micro-pad 2223 formed of Cu, or the like is formed over the surface part thereof.

In addition, a via (VIA) 2224 is formed in the wiring layer 222 in order to connect the diffusion region 2211 and the wiring 2222 or the wiring 2222 and the micro-pad 2223.

In the image sensor 100H, a photoelectric conversion film 240 is formed on the wiring layer 202 of the first semiconductor layer 200, and the wiring 2022 of the first semiconductor layer 200 and the wiring 2122 of the second semiconductor layer 210 are connected by a through hole VIA 203 which penetrates the first semiconductor layer 200.

In addition, the micro-pad 2123 of the wiring layer 212 of the second semiconductor layer 210 and the micro-pad 2223 of the wiring layer 222 of the third semiconductor layer 220 are connected by a through hole VIA electrode 213H which penetrates the second semiconductor layer 210.

Furthermore, as a photoelectric conversion film on the wiring layer, an organic photoelectric conversion film is well known. In addition, the semiconductor layer may be stacked with any number of layers.

As such, if a photoelectric conversion layer is formed on a layer different from the transistors within the first semiconductor layer 200, it is possible to arrange separation means and stack-connecting terminals with a high degree of freedom without reducing the area of light sensing elements.

In addition, it is possible to stack signal processing circuits or memory circuits as a semiconductor layer of the third semiconductor layer and to be connected by the stack-connecting terminal 118.

<11. Ninth Embodiment>

Figure 22:
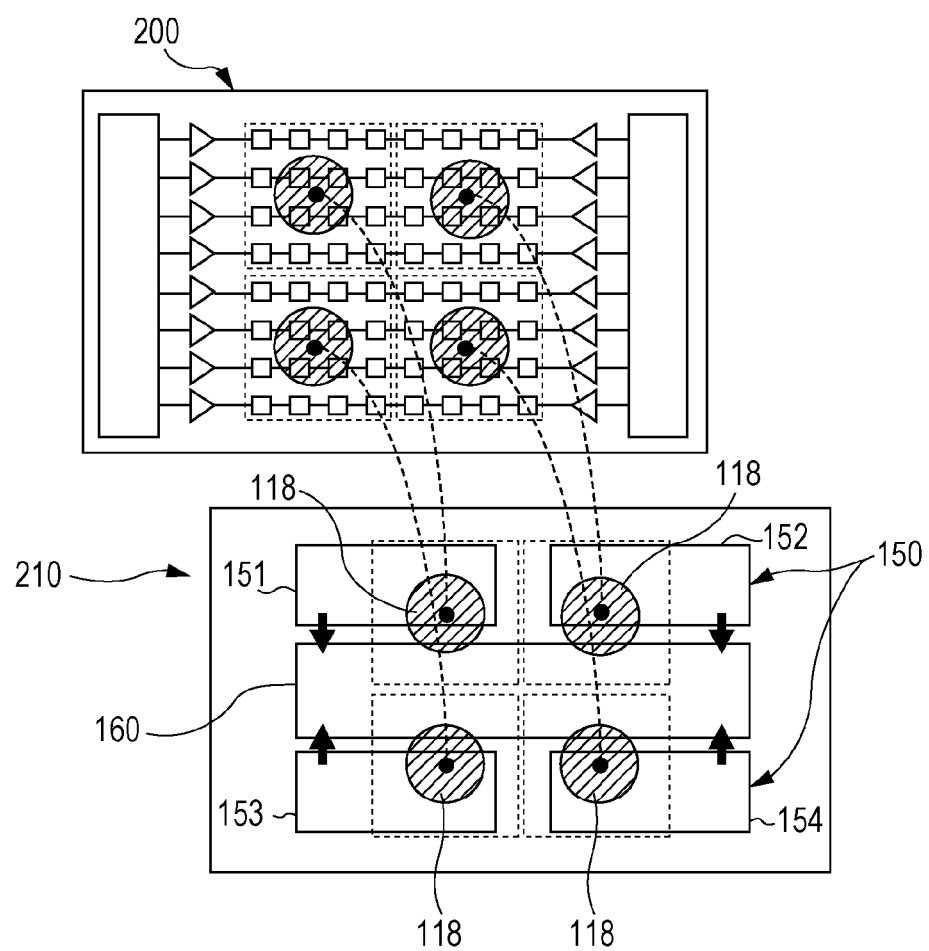
FIG. 22 is a diagram showing a stacking structure example of a first semiconductor layer and a second semiconductor layer of a CMOS image sensor (solid-state imaging element) according to a ninth embodiment of the technology.

FIG. 22 is a diagram showing a stacking structure example of a first semiconductor layer and a second semiconductor layer of a CMOS image sensor (solid-state imaging element) according to a ninth embodiment of the technology.

In the CMOS image sensor 100I according to the ninth embodiment, the first semiconductor layer 200 is formed in the same layout as in FIG. 13, and the second semiconductor layer 210 is formed with an AD conversion unit 150 and a signal processing unit 160.

In the example of FIG. 22, one signal processing unit 160 is arranged in the center part, and respective two AD conversion units 150 are arranged in both sides of long edge parts.

In addition, in the CMOS image sensor 100I, AD conversion circuits 151, 152, 153, and 154 are arranged in respectively parallel with each stack-connecting terminal 118.

Furthermore, if the pixel cells have amplifying circuits for signal output, a pixel sharing type in which a plurality of light sensing elements shares the amplifying circuits, a pixel configuration in which a charge holding region that realizes batch exposure is provided in a pixel, or the like is also acceptable.

As described above, it is possible to obtain the following effects according to the technology.

In an image sensor in which a connecting terminal that is connected to a stacked (three-dimensionally mounted) different semiconductor layer is shared in an amplifying circuit of a plurality of pixel cells, it is possible to reduce parasitic capacitance of an output signal line and realize speed-up and low power consumption of reading out of output signals from the pixels.

In addition, since the above effect can be realized only with simple addition of switch circuits and wiring, almost no influence is given to the reduction of light sensing elements or deterioration in resolution in a rear surface irradiation image sensor or an image sensor using an organic photoelectric conversion film.

By arranging a stack-connecting terminal and a separation part at a branch point in the vicinity of the center of a pixel group connected thereto, there are effects of speed-up and low power consumption by minimized parasitic capacitance and of reducing the range of an input voltage necessary for an analog signal processing circuit of the latter stage by uniform wiring resistance.

A solid-state imaging element that brings the above effects can be applied as an imaging device of a digital camera or a video camera.

<12. Tenth Embodiment>

Figure 23:
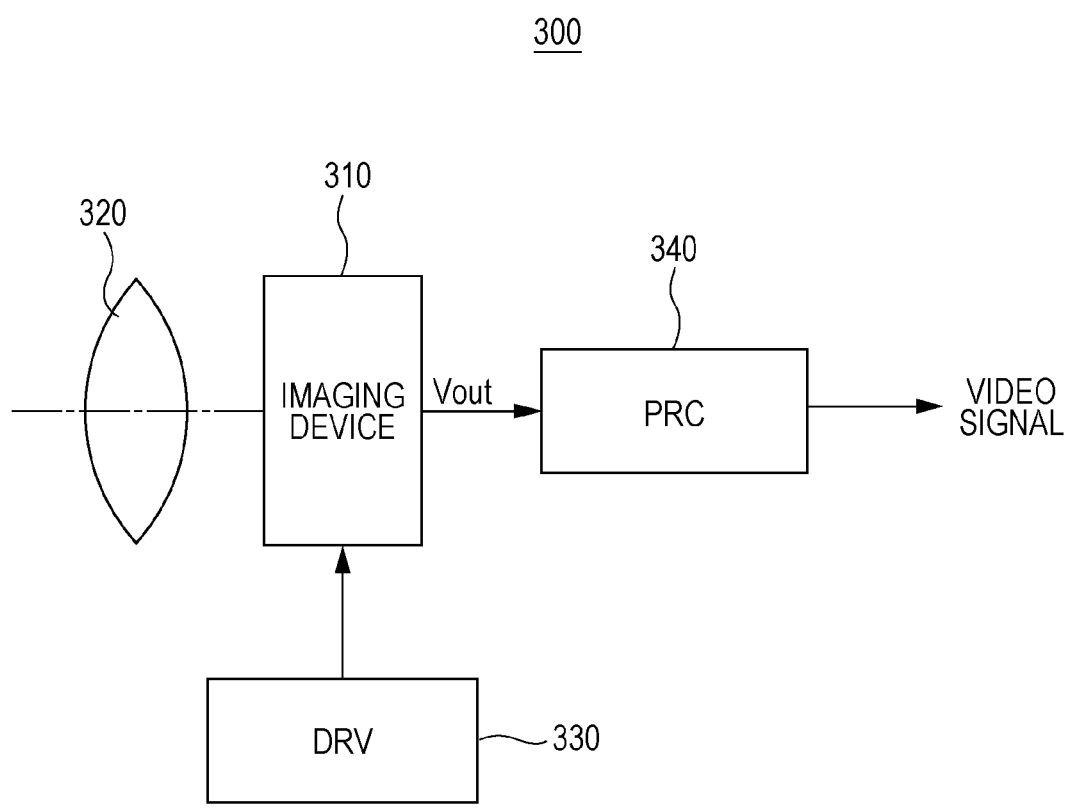
FIG. 23 is a diagram showing an example of a configuration of a camera system to which the solid-state imaging elements according to the embodiments of the technology are applied.

FIG. 23 is a diagram showing an example of a configuration of a camera system to which the solid-state imaging elements according to the embodiments of the technology are applied.

The camera system 300 is provided with an imaging device 310 to which one of the CMOS image sensors (solid-state imaging elements) 100 and 100A to 100I according to the embodiments is applicable, as shown in FIG. 23.

Furthermore, the camera system 300 includes an optical system that leads incident light to a pixel region of the imaging device 310 (forms the image of a subject), for example, a lens 320 that forms an image on an imaging plane with the incident light (image light).

The camera system 300 includes a driving circuit (DRV) 330 which drives the imaging device 310 and a signal processing circuit (PRC) 340 which processes output signals of the imaging device 310.

The driving circuit 330 has a timing generator (not shown in the drawing) which generates various timing signals including start pulses and clock pulses that drive circuits in the imaging device 310 and drives the imaging device 310 with a predetermined time signal.

In addition, the signal processing circuit 340 performs a predetermined signal process for output signals of the imaging device 310.

The image signals processed in the signal processing circuit 340 are recorded on a recording medium, for example, a memory, or the like. Image information recorded on the recording medium is made into hard copy by a printer, or the like. In addition, the image signals processed in the signal processing circuit 340 are displayed as moving images on a monitor including a liquid crystal display or the like.

As described above, it is possible to realize a camera with high precision and low power consumption by mounting the above-described imaging elements 100 and 100A to 100I in an imaging device including a digital still camera, or the like as the imaging device 310.

The present disclosure contains subject matter related to that disclosed in Japanese Priority Patent Application JP 2010-197734 filed in the Japan Patent Office on Sep. 3, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
   a first semiconductor layer including:
      a first semiconductor substrate including
      a first group of pixel cells, a second group of pixel cells, and a third group of pixel cells, wherein each pixel cell of the first, second, and third groups of pixel cells includes a floating diffusion region, a reset transistor, an amplification transistor and a selection transistor, and
      a first wiring layer disposed at a side opposite to a light-incident side of the first semiconductor substrate, wherein the first wiring layer includes:
         a first signal line coupled to the selection transistor in each pixel cell of the first group of pixel cells,
         a second signal line coupled to the selection transistor in each pixel cell of the second group of pixel cells, and
         a third signal line coupled to the selection transistor in each pixel cell of the third group of pixel cells; and
   a second semiconductor layer including:
      a second semiconductor substrate, and
      a second wiring layer disposed at a first side of the second semiconductor substrate, wherein the side opposite to the light-incident side of the first semiconductor substrate and the first side of the second semiconductor substrate face each other, and wherein the first semiconductor layer is bonded to the second semiconductor layer; and
   first and second vias at least partially disposed in the first semiconductor substrate;
   a first switch coupled to the first via and to the first and second signal lines; and
   a second switch coupled to the second via and the third signal line.

2. The imaging device of claim 1, further comprising:
   a stack connecting terminal between the first switch and the second semiconductor layer.

3. The imaging device of claim 2, wherein the stack connecting terminal is arranged in a vicinity of a center of a pixel group including the first group of pixel cells and the second group of pixel cells.

4. The imaging device of claim 1, wherein the first switch is arranged in a vicinity of a center of a pixel group including the first group of pixel cells and the second group of pixel cells.

5. The imaging device of claim 1, further comprising dummy elements that are not connected to either of the first or second signal lines and that are arranged in a two-dimensional array of pixel groups.

6. The imaging device of claim 1, wherein the amplification transistor of a pixel cell of the first pixel group includes a gate terminal configured to receive signals from a photoelectric conversion element of the pixel cell of the first pixel group, a drain terminal connected to a power supply, and a source terminal selectively connected to the first signal line through the selection transistor of the pixel cell of the first pixel group.

7. The imaging device of claim 6, wherein the amplification transistor of a pixel cell of the second pixel group includes a gate terminal configured to receive signals from a photoelectric conversion element of the pixel cell of the second pixel group, a drain terminal connected to a power supply, and a source terminal selectively connected to the second signal line through the selection transistor of the pixel cell of the second pixel group.

8. The imaging device of claim 1, wherein the first semiconductor layer includes a light-sensing element that senses light radiated from a face opposite to a face where transistors and the first wiring layer is formed.

9. The imaging device of claim 1, wherein a photoelectric conversion film as a light-sensing element is formed on the first wiring layer.

10. The imaging device of claim 2, wherein the stack connecting terminal includes a first micro-pad arranged on an outermost layer of the first semiconductor layer and a second micro-pad arranged on an outermost layer of the second semiconductor layer, the second micro-pad being at a location corresponding to the first micro-pad and being connected to the first micro-pad through a micro-bump.

11. The imaging device of claim 2, wherein the stack connecting terminal includes a first micro-pad arranged on an outermost layer of the first semiconductor layer and a second micro-pad arranged on an outermost layer of the second semiconductor layer, the second micro-pad being at a location corresponding to the first micro-pad and being directly pasted to the first micro-pad.

12. The imaging device of claim 2, wherein the first and second wiring layers are connected by a through hole via electrode.

13. The imaging device of claim 2, wherein the stack connecting terminal includes the first via penetrating the semiconductor layer on an insulating layer of both or either of the first semiconductor layer and the second semiconductor layer.

14. The imaging device of claim 1, wherein the second semiconductor layer includes a plurality of analog-to-digital (AD) conversion units.

15. The imaging device of claim 1, further comprising at least one of a signal processing circuit and a memory circuit on a third semiconductor layer.

16. An imaging device comprising:
   a first semiconductor layer including:
      a first semiconductor substrate including a first group of pixel cells, a second group of pixel cells, and a third group of pixel cells, wherein each pixel cell of the first, second, and third groups of pixel cells includes a floating diffusion region, a reset transistor, an amplification transistor and a selection transistor, and
      a first wiring layer disposed at a side opposite to a light-incident side of the first semiconductor substrate, wherein the first wiring layer includes:
         a first signal line coupled to the selection transistor in each pixel cell of the first group of pixel cells,
         a second signal line coupled to the selection transistor in each pixel cell of the second group of pixel cells, and
         a third signal line coupled to the selection transistor in each pixel cell of the third group of pixel cells; and
   a second semiconductor layer including:
      a second semiconductor substrate, and
      a second wiring layer disposed at a first side of the second semiconductor substrate, wherein the side opposite to the light-incident side of the first semiconductor substrate and the first side of the second semiconductor substrate face each other, and wherein the first semiconductor layer is bonded to the second semiconductor layer;

first and second vias at least partially disposed in the first semiconductor substrate;
a first switch coupled to the first and second signal lines; and
a second switch coupled to the third signal line, wherein,
the second semiconductor substrate is configured to receive a first signal from the first group of pixel cells via the first switch and the first via, a second signal from the second group of pixel cells via the first switch and the first via, and a third signal from the third group of pixel cells via the second switch and the second via.

17. The imaging device of claim 16, further comprising:
a stack connecting terminal between the first switch and the second semiconductor layer.

18. The imaging device of claim 17, wherein the stack connecting terminal is arranged in a vicinity of a center of a pixel group including the first group of pixel cells and the second group of pixel cells.

19. The imaging device of claim 16, wherein the first switch is arranged in a vicinity of a center of a pixel group including the first group of pixel cells and the second group of pixel cells.

20. The imaging device of claim 16, further comprising dummy elements that are not connected to either of the first or second signal lines and that are arranged in a two-dimensional array of pixel groups.

21. The imaging device of claim 16, wherein the amplification transistor of a pixel cell of the first pixel group includes a gate terminal configured to receive signals from a photoelectric conversion element of the pixel cell of the first pixel group, a drain terminal connected to a power supply, and a source terminal selectively connected to the first signal line through the selection transistor of the pixel cell of the first pixel group.

22. The imaging device of claim 21, wherein the amplification transistor of a pixel cell of the second pixel group includes a gate terminal configured to receive signals from a photoelectric conversion element of the pixel cell of the second pixel group, a drain terminal connected to a power supply, and a source terminal selectively connected to the second signal line through the selection transistor of the pixel cell of the second pixel group.

23. The imaging device of claim 16, wherein the first semiconductor layer includes a light-sensing element that senses light radiated from a face opposite to a face where transistors and the first wiring layer is formed.

24. The imaging device of claim 16, wherein a photoelectric conversion film as a light-sensing element is formed on the first wiring layer.

25. The imaging device of claim 17, wherein the stack connecting terminal includes a first micro-pad arranged on an outermost layer of the first semiconductor layer and a second micro-pad arranged on an outermost layer of the second semiconductor layer, the second micro-pad being at a location corresponding to the first micro-pad and being connected to the first micro-pad through a micro-bump.

26. The imaging device of claim 17, wherein the stack connecting terminal includes a first micro-pad arranged on an outermost layer of the first semiconductor layer and a second micro-pad arranged on an outermost layer of the second semiconductor layer, the second micro-pad being at a location corresponding to the first micro-pad and being directly pasted to the first micro-pad.

27. The imaging device of claim 17, wherein the first and second wiring layers are connected by a through hole via electrode.

28. The imaging device of claim 17, wherein the stack connecting terminal includes the first via penetrating the semiconductor layer on an insulating layer of both or either of the first semiconductor layer and the second semiconductor layer.

29. The imaging device of claim 16, wherein the second semiconductor layer includes a plurality of analog-to-digital (AD) conversion units.

30. The imaging device of claim 16, further comprising at least one of a signal processing circuit and a memory circuit on a third semiconductor layer.

* * * * *